United States Patent
Chae et al.

(10) Patent No.: US 12,098,248 B2
(45) Date of Patent: Sep. 24, 2024

(54) POLY(AMIDE-IMIDE) COPOLYMER, COMPOSITION FOR PREPARING SAME, ARTICLE INCLUDING SAME, AND DISPLAY DEVICE INCLUDING THE ARTICLE

(71) Applicants: SAMSUNG ELECTRONICS CO., LTD., Suwon-si (KR); SAMSUNG SDI CO., LTD., Yongin-si (KR)

(72) Inventors: Jungha Chae, Suwon-si (KR); Kyeong-sik Ju, Suwon-si (KR)

(73) Assignees: SAMSUNG ELECTRONICS CO., LTD., Gyeonggi-do (KR); SAMSUNG SDI CO., LTD., Gyeonggi-do (KR)

(*) Notice: Subject to any disclaimer, the term of this patent is extended or adjusted under 35 U.S.C. 154(b) by 850 days.

(21) Appl. No.: 16/676,879

(22) Filed: Nov. 7, 2019

(65) Prior Publication Data

US 2020/0148829 A1 May 14, 2020

(30) Foreign Application Priority Data

Nov. 8, 2018 (KR) .................. 10-2018-0136755

(51) Int. Cl.
| | | |
|---|---|---|
| C08G 73/14 | (2006.01) | |
| C08G 73/10 | (2006.01) | |
| G02F 1/1333 | (2006.01) | |
| H10K 77/10 | (2023.01) | |

(52) U.S. Cl.
CPC .......... *C08G 73/14* (2013.01); *C08G 73/1028* (2013.01); *G02F 1/133305* (2013.01); *H10K 77/111* (2023.02)

(58) Field of Classification Search
CPC ....... C08G 73/14; C08L 79/08; C08J 2379/08
See application file for complete search history.

(56) References Cited

U.S. PATENT DOCUMENTS

| | | | |
|---|---|---|---|
| 5,521,276 A | 5/1996 | Choi et al. | |
| 5,824,766 A | 10/1998 | Choi et al. | |
| 8,222,365 B2 | 7/2012 | Shimeno et al. | |
| 9,018,343 B2 | 4/2015 | Park et al. | |
| 10,619,045 B2 | 4/2020 | Ahn et al. | |
| 11,059,954 B2 | 7/2021 | Jo et al. | |
| 2011/0160407 A1 | 6/2011 | Touraud et al. | |
| 2016/0222165 A1* | 8/2016 | Wakita ............... | C08G 73/1082 |
| 2016/0222210 A1 | 8/2016 | Hoffmann et al. | |
| 2016/0222249 A1* | 8/2016 | Choi .................. | C08G 73/1039 |
| 2017/0101509 A1* | 4/2017 | Jee ..................... | C08G 73/14 |
| 2017/0130003 A1* | 5/2017 | Sato ................... | C08G 73/1017 |
| 2017/0183462 A1 | 6/2017 | Song et al. | |
| 2017/0190880 A1 | 7/2017 | Jo et al. | |
| 2019/0010292 A1 | 1/2019 | Yun et al. | |

FOREIGN PATENT DOCUMENTS

| | | |
|---|---|---|
| CN | 101589089 A | 11/2009 |
| CN | 10697718 A | 7/2017 |
| CN | 106928706 A | 7/2017 |
| CN | 106957427 A | 7/2017 |

(Continued)

OTHER PUBLICATIONS

Yi et al Synthesis and characterization of poly(amideimide)s containing aliphatic diamine moieties, Die Angewandte Makrornolekulare Chernie 233 (199s) 89-101 (Nr. 4057), published on Feb. 1995.*
English Translation of First Office Action issued Mar. 23, 2023 in corresponding Chinese Patent Application No. 201911086125X, 15 pgs.
First Office Action issued Mar. 23, 2023 by the China National Intellectual Property Administration in corresponding Chinese Patent Application No. 201911086125.X, 15 pgs.
Peng, Zhihan et al., "A Handbook of Plastic Industry—Polyamides," Chemical Industry Press, Nov. 30, 2001, p. 678. (See, Concise Explanation of the Relevance of the reference).

(Continued)

*Primary Examiner* — Gregory Listvoyb
(74) *Attorney, Agent, or Firm* — CANTOR COLBURN LLP

(57) ABSTRACT

A poly(amide-imide) copolymer that is a reaction product of a diamine represented by Chemical Formula 1, a diamine represented by Chemical Formula 2, a dicarbonyl compound represented by Chemical Formula 3, and a tetracarboxylic acid dianhydride represented by Chemical Formula 4, a composition for preparing the poly(amide-imide copolymer, and an article including the copolymer, e.g., a film are provided:

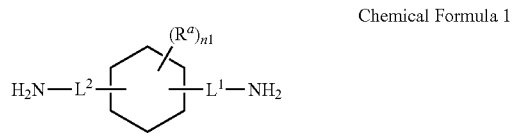

Chemical Formula 1

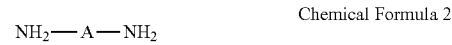

Chemical Formula 2

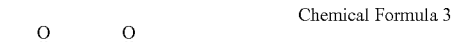

Chemical Formula 3

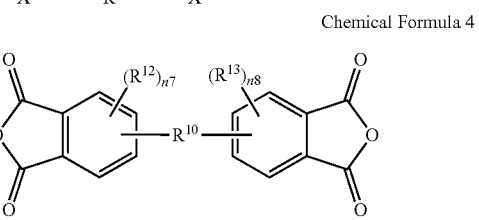

Chemical Formula 4 wherein, in Chemical Formulae 1 to 4, $R^a$, $L^1$, $L^2$, n1, A, $R^3$, X, $R^{10}$, $R^{12}$, $R^{13}$, n7 and n8 are the same as defined in the specification.

13 Claims, No Drawings

(56) References Cited

FOREIGN PATENT DOCUMENTS

| | | |
|---|---|---|
| CN | 108727588 A | 11/2018 |
| EP | 3162837 A1 | 5/2017 |
| EP | 3392294 A1 | 10/2018 |
| JP | 2010180292 A | 8/2010 |
| JP | 2012087236 A | 5/2012 |
| KR | 20130035691 A | 4/2013 |
| KR | 20170076171 A | 7/2017 |
| KR | 20170080532 A | 7/2017 |
| KR | 1020170121878 A | 11/2017 |
| WO | 2018097143 A1 | 5/2018 |

OTHER PUBLICATIONS

Yi, Mi Hie et al., "Synthesis and characterization of poly(amideimide)s containing aliphatic diamine moieties", Die Angewandte Makromolekulare Chemie, 223, 1995, pp. 89-101, 13 pp.

English Translation of Office Action dated Sep. 20, 2023 of the corresponding Korean Patent Application No. 10-2018-0136755, 7 pp.

Office Action dated Sep. 20, 2023 of the corresponding Korean Patent Application No. 10-2018-0136755, 6 pp.

\* cited by examiner

POLY(AMIDE-IMIDE) COPOLYMER, COMPOSITION FOR PREPARING SAME, ARTICLE INCLUDING SAME, AND DISPLAY DEVICE INCLUDING THE ARTICLE

CROSS-REFERENCE TO RELATED APPLICATION

This application claims priority to Korean Patent Application No. 10-2018-0136755, filed on Nov. 8, 2018, and all the benefits accruing therefrom under 35 U.S.C. § 119, the content of which in its entirety is herein incorporated by reference.

BACKGROUND

1. Field

This disclosure relates to a poly(amide-imide) copolymer, a composition for preparing a poly(amide-imide) copolymer, an article including a poly(amide-imide) copolymer, and to a display device including the article.

2. Description of the Related Art

A flexible display, which is not restricted by time and place, that is thin and flexible like paper, ultra-light, and consumes a small amount of electricity, has been increasingly in demand as a display for visualizing various information and delivering it to the users. The flexible display may be realized by using a flexible substrate, organic and inorganic materials for a low temperature process, flexible electronics, encapsulation, packaging, or the like.

A transparent plastic film for replacing a conventional window cover glass to be used in a flexible display desirably has high toughness and excellent optical properties. Desired optical properties include high light transmittance, low haze, low yellowness index, low YI difference after exposure to UV light, or the like.

SUMMARY

An embodiment provides a poly(amide-imide) copolymer having improved optical and mechanical properties.

Another embodiment provides a composition for preparing the poly(amide-imide) copolymer.

Still another embodiment provides an article including the poly(amide-imide) copolymer.

Yet another embodiment provides a display device including the article including the poly(amide-imide) copolymer.

According to an embodiment, provided is a poly(amide-imide) copolymer that is a reaction product of a diamine represented by Chemical Formula 1, a diamine represented by Chemical Formula 2, a dicarbonyl compound represented by Chemical Formula 3, and a tetracarboxylic acid dianhydride represented by Chemical Formula 4:

Chemical Formula 1

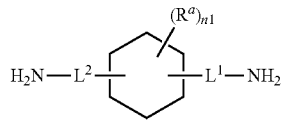

wherein in Chemical Formula 1,
$R^a$ is a substituted or unsubstituted C1 to C30 aliphatic organic group, a substituted or unsubstituted C3 to C30 alicyclic organic group, a substituted or unsubstituted C6 to C30 aromatic organic group, or a combination thereof, $L^1$ and $L^2$ are each independently a single bond, a substituted or unsubstituted C1 to C30 aliphatic organic group, a substituted or unsubstituted C3 to C30 alicyclic organic group, a substituted or unsubstituted C6 to C30 aromatic organic group, or a combination thereof, and n1 is an integer ranging from 0 to 4;

$$NH_2\text{-A-}NH_2 \qquad \text{Chemical Formula 2}$$

wherein in Chemical Formula 2,
A is a ring system including two or more C6 to C30 aromatic rings linked by a single bond, wherein each of the two or more of the aromatic rings is independently unsubstituted or substituted with an electron-withdrawing group;

Chemical Formula 3

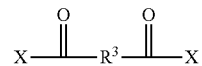

wherein, in Chemical Formula 3,
$R^3$ is a substituted or unsubstituted phenylene group or a substituted or unsubstituted biphenylene group, and each X is an identical or a different halogen atom; and Chemcial Formula 4

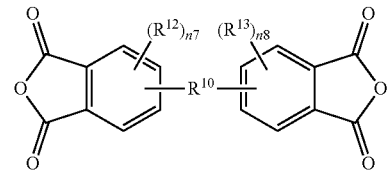

wherein, in Chemical Formula 4,
$R^{10}$ is a single bond, —O—, —S—, —C(=O)—, —CH(OH)—, —C(=O)NH—, —S(=O)$_2$—, —Si(CH$_3$)$_2$—, —(CH$_2$)$_p$—, —(CF$_2$)$_q$—, —C(C$_n$H$_{2n+1}$)$_2$—, —C(C$_n$F$_{2n+1}$)$_2$—, —(CH$_2$)$_p$C(C$_n$H$_{2n+1}$)$_2$(CH$_2$)$_q$—, or —(CH$_2$)$_p$C(C$_n$F$_{2n+1}$)$_2$(CH$_2$)$_q$— wherein 1≤n≤10, 1≤p≤10, and 1≤q≤10, $R^{12}$ and $R^{13}$ are each independently a halogen, a hydroxy group, a substituted or unsubstituted C1 to C10 aliphatic organic group, a substituted or unsubstituted C6 to C20 aromatic organic group, a group of formula —OR$^{201}$, wherein R$^{201}$ is a C1 to C10 aliphatic organic group, or a silyl group of formula —SiR$^{210}$R$^{211}$R$^{212}$, wherein R$^{210}$, R$^{211}$, and R$^{212}$ are each independently hydrogen or a C1 to C10 aliphatic organic group, and n7 and n8 are each independently an integer ranging from 0 to 3.

In Chemical Formula 1, $R^a$ may be a substituted or unsubstituted C1 to C30 alkyl group, a substituted or unsubstituted C3 to C30 cycloalkyl group, a substituted or unsubstituted C6 to C30 aryl group, or a combination thereof, $L^1$ and $L^2$ are each independently a single bond, a substituted or unsubstituted C1 to C30 alkylene group, a substituted or unsubstituted C3 to C30 cycloalkylene group, a substituted or unsubstituted C6 to C30 arylene group, or a combination thereof, and n1 is an integer ranging from 0 to 3.

In Chemical Formula 1, $R^a$ is a substituted or unsubstituted C1 to C30 alkyl group, $L^1$ and $L^2$ are each independently a single bond, a substituted or unsubstituted C1 to C30 alkylene group, and n1 is an integer ranging from 1 to 3.

The diamine represented by Chemical Formula 1 may be represented by Chemical Formula 1-1:

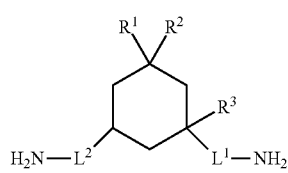

Chemical Formula 1-1 wherein in Chemical Formula 1-1, $R^1$, $R^2$, and $R^3$ are each independently is a substituted or unsubstituted C1 to C20 alkyl group, a substituted or unsubstituted C3 to C20 cycloalkyl group, a substituted or unsubstituted C6 to C20 aryl group, or a combination thereof, $L^1$ and $L^2$ are each independently a single bond, a substituted or unsubstituted C1 to C20 alkylene group, a substituted or unsubstituted C3 to C20 cycloalkylene group, a substituted or unsubstituted C6 to C20 arylene group, or a combination thereof.

The diamine represented by Chemical Formula 2 may have a ring system including two C6 to C12 aromatic rings linked by a single bond, wherein each of the two C6 to C12 aromatic rings may be substituted with a halogen atom, a nitro group, a cyano group, a C1 or C2 haloalkyl group, a C2 to C6 alkanoyl group, or a C2 to C6 ester group.

The diamine represented by Chemical Formula 2 may include at least one of the diamines represented by chemical formulae:

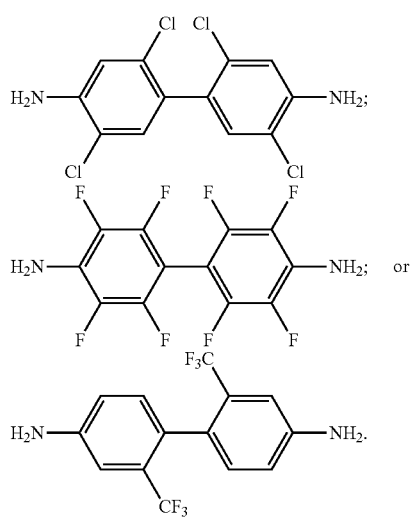

The diamine represented by Chemical Formula 2 may include the diamine represented by Chemical Formula A:

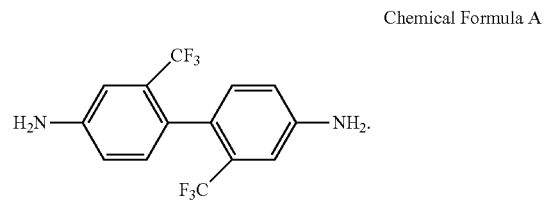 [SMILES: Nc1ccc(-c2ccc(N)cc2C(F)(F)F)c(C(F)(F)F)c1]

Chemical Formula A

In Chemical Formula 3, $R^3$ may be a phenylene group, and each X may be independently Cl or Br.

The tetracarboxylic acid dianhydride represented by Chemical Formula 4 may include at least one of 3,3',4,4'-biphenyl tetracarboxylic dianhydride (BPDA), 3,3',4,4'-diphenylsulfone tetracarboxylic dianhydride (DSDA), 4,4'-(hexafluoroisopropylidene)diphthalic anhydride (6FDA), or 4,4'-oxydiphthalic anhydride (ODPA).

The tetracarboxylic acid dianhydride represented by Chemical Formula 4 may include a combination of 3,3',4,4'-biphenyl tetracarboxylic dianhydride (BPDA) and 4,4'-(hexafluoroisopropylidene)diphthalic anhydride (6FDA).

An amount of the diamine represented by Chemical Formula 1 may be less than or equal to 50 mole percent based on the total amount of the diamine represented by Chemical Formula 1 and the diamine represented by Chemical Formula 2.

A mole ratio of the dicarbonyl compound represented by Chemical Formula 3 and the tetracarboxylic acid dianhydride represented by Chemical Formula 4 may be 30 to 70:70 to 30.

According to an embodiment, provided is a composition for preparing a poly(amide-imide) copolymer including a diamine represented by Chemical Formula 1, a tetracarboxylic acid dianhydride represented by Chemical Formula 4, and a compound represented by Chemical Formula 5:

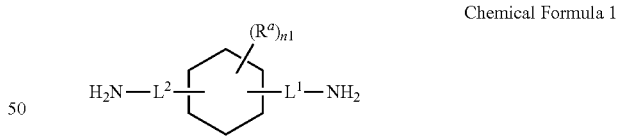

Chemical Formula 1 wherein in Chemical Formula 1, $R^a$ is a substituted or unsubstituted C1 to C30 aliphatic organic group, a substituted or unsubstituted C3 to C30 alicyclic organic group, a substituted or unsubstituted C6 to C30 aromatic organic group, or a combination thereof, $L^1$ and $L^2$ are each independently a single bond, a substituted or unsubstituted C1 to C30 aliphatic organic group, a substituted or unsubstituted C3 to C30 alicyclic organic group, a substituted or unsubstituted C6 to C30 aromatic organic group, or a combination thereof, and n1 is an integer ranging from 0 to 4;

Chemical Formula 4

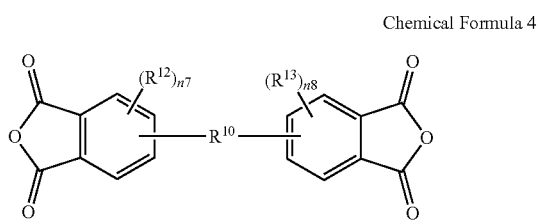

wherein, in Chemical Formula 4,

R$^{10}$ is a single bond, —O—, —S—, —C(=O)—, —CH(OH)—, —C(=O)NH—, —S(=O)$_2$—, —Si(CH$_3$)$_2$—, —(CH$_2$)$_p$—, —(CF$_2$)$_q$—, —C(C$_n$H$_{2n+1}$)$_2$—, —C(C$_n$F$_{2n+1}$)$_2$—, —(CH$_2$)$_p$C(C$_n$H$_{2n+1}$)$_2$(CH$_2$)$_q$—, or —(CH$_2$)$_p$C(C$_n$F$_{2n+1}$)$_2$(CH$_2$)$_q$— wherein 1≤n≤10, 1≤p≤10, and 1≤q≤10, R$^{12}$ and R$^{13}$ are each independently a halogen, a hydroxy group, a substituted or unsubstituted C1 to C10 aliphatic organic group, a substituted or unsubstituted C6 to C20 aromatic organic group, a group of formula —OR$^{201}$, wherein R$^{201}$ is a C1 to C10 aliphatic organic group, or a silyl group of formula —SiR$^{210}$R$^{211}$R$^{212}$, wherein R$^{210}$, R$^{211}$, and R$^{212}$ are each independently hydrogen or a C1 to C10 aliphatic organic group, and n7 and n8 are each independently an integer ranging from 0 to 3.

Chemical Formula 5

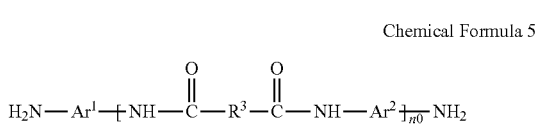

wherein, in Chemical Formula 5,

R$^3$ is a substituted or unsubstituted phenylene group or a substituted or unsubstituted biphenylene group, n0 is an integer of greater than or equal to 1, and Ar$^1$ and Ar$^2$ are, each independently, represented by Chemical Formula 6:

Chemical Formula 6

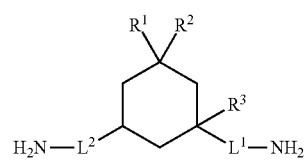

wherein, in Chemical Formula 6,

R$^6$ and R$^7$ are each independently —CF$_3$, —CCl$_3$, —CBr$_3$, —Cl$_3$, —NO$_2$, —CN, —C(=O)CH$_3$, and —CO$_2$O$_2$H$_5$, R$^8$ and R$^9$ are each independently a halogen, a hydroxy group, a substituted or unsubstituted C1 to C10 aliphatic organic group, or a substituted or unsubstituted C6 to C20 aromatic organic group, a group of formula —OR$^{204}$ wherein R$^{204}$ is a C1 to C10 aliphatic organic group, or a silyl group of formula —SiR$^{205}$R$^{206}$R$^{207}$ wherein R$^{205}$, R$^{206}$, and R$^{207}$ are each independently hydrogen, or a C1 to C10 aliphatic organic group, n3 is an integer ranging from 1 to 4, n5 is an integer ranging from 0 to 3, provided that n3+n5 is an integer ranging from 1 to 4, and n4 is an integer ranging from 1 to 4, n6 is an integer ranging from 0 to 3, provided that n4+n6 is an integer ranging from 1 to 4.

The composition may further include a diamine represented by Chemical Formula 2:

NH$_2$-A-NH$_2$  Chemical Formula 2 wherein in Chemical Formula 2,

A is a ring system including two or more C6 to C30 aromatic rings linked by a single bond, wherein each of the two or more aromatic rings is independently unsubstituted or substituted with an electron-withdrawing group.

In Chemical Formula 1, R$^a$ may be a substituted or unsubstituted C1 to C30 alkyl group, a substituted or unsubstituted C3 to C30 cycloalkyl group, a substituted or unsubstituted C6 to C30 aryl group, or a combination thereof, L$^1$ and L$^2$ are each independently a single bond, a substituted or unsubstituted C1 to C30 alkylene group, a substituted or unsubstituted C3 to C30 cycloalkylene group, a substituted or unsubstituted C6 to C30 arylene group, or a combination thereof, and n1 is an integer ranging from 0 to 3.

The diamine represented by Chemical Formula 1 may be represented by Chemical Formula 1-1:

Chemical Formula 1-1

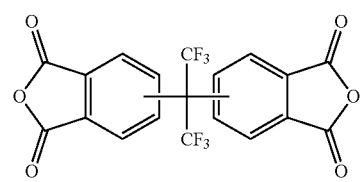

wherein in Chemical Formula 1-1,

R$^1$, R$^2$, and R$^3$ are each independently a substituted or unsubstituted C1 to C20 alkyl group, a substituted or unsubstituted C3 to C20 cycloalkyl group, a substituted or unsubstituted C6 to C20 aryl group, or a combination thereof, L$^1$ and L$^2$ are each independently a single bond, a substituted or unsubstituted C1 to C20 alkylene group, a substituted or unsubstituted C3 to C20 cycloalkylene group, a substituted or unsubstituted C6 to C20 arylene group, or a combination thereof.

The tetracarboxylic acid dianhydride represented by Chemical Formula 4 may be a combination of the compound represented by Chemical Formula 4-1 and the compound represented by Chemical Formula 4-2.

Chemical Formula 4-1

Chemical Formula 4-2

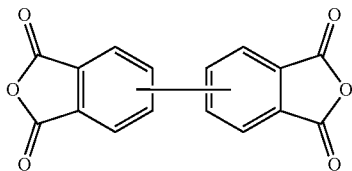

According to another embodiment, provided is an article including a poly(amide-imide) copolymer according to an embodiment or a poly(amide-imide) copolymer prepared from a composition for preparing the same according to another embodiment.

The article may be a film, wherein the film may have a transmittance of greater than or equal to 88.8 percent (%) in a wavelength range from 350 nanometers (nm) to 750 nanometers, a yellowness index (YI) of less than 2, a refractive index of less than 1.7, and a tensile modulus of greater than or equal to 5 GPa.

According to another embodiment, provided is a display device including an article according to an embodiment.

Hereinafter, further embodiments will be described in detail.

DETAILED DESCRIPTION

This disclosure will be described more fully hereinafter in which embodiments are shown. This disclosure may, however, be embodied in many different forms and is not to be construed as limited to the exemplary embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. It will be understood that when an element is referred to as being "on" another element, it may be directly on the other element or intervening elements may be present therebetween. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

As used herein, the singular forms "a," "an" and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) as used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

"Mixture" as used herein is inclusive of all types of combinations, including blends, alloys, solutions, or the like.

As used herein, when a specific definition is not otherwise provided, the term "substituted" refers to a group or compound substituted with at least one substituent including a halogen (—F, —Br, —Cl, or —I), a hydroxy group, a nitro group, a cyano group, an amino group (—NH$_2$, —NH(R$^{100}$) or —N(R$^{101}$)(R$^{102}$), wherein R$^{100}$, R$^{101}$, and R$^{102}$ are the same or different, and are each independently a C1 to C10 alkyl group), an amidino group, a hydrazine group, a hydrazone group, a carboxyl group, an ester group, a ketone group, a substituted or unsubstituted alkyl group, a substituted or unsubstituted alicyclic organic group, a substituted or unsubstituted aryl group, a substituted or unsubstituted alkenyl group, a substituted or unsubstituted alkynyl group, a substituted or unsubstituted heteroaryl group, and a substituted or unsubstituted heterocyclic group, in place of at least one hydrogen of a functional group, or the substituents may be linked to each other to provide a ring.

As used herein, the term "alkyl group" refers to a straight or branched chain saturated aliphatic hydrocarbon group having the specified number of carbon atoms and having a valence of one. Non-limiting examples of the alkyl group are methyl, ethyl, and propyl.

As used herein, the term "alkoxy group" refers to "alkyl-O—", wherein the term "alkyl" has the same meaning as described above. Non-limiting examples of the alkoxy group are methoxy, ethoxy, and propoxy.

As used herein, when a definition is not otherwise provided, the term "alkanoyl" represents "alkyl-C(=O)—", wherein the term "alkyl" has the same meaning as described above.

As used herein, when a definition is not otherwise provided, the term "ester group" represents "—COO-alkyl", wherein the term "alkyl" has the same meaning as described above.

As used herein, the term "arene" or "aryl group", which is used alone or in combination, refers to an aromatic hydrocarbon group containing at least one ring. Non-limiting examples of the arene are benzene and naphthalene, and of the aryl group are phenyl, naphthyl, and tetrahydronaphthyl.

As used herein, the term "alkylene" indicates a straight or branched saturated aliphatic hydrocarbon group having a valence of at least two, optionally substituted with one or more substituents where indicated, provided that the valence of the alkylene group is not exceeded.

As used herein, the term "cycloalkylene" indicates a cyclic saturated aliphatic hydrocarbon group having a valence of at least two, optionally substituted with one or more substituents where indicated, provided that the valence of the cycloalkylene group is not exceeded.

As used herein, when a definition is not otherwise provided, the term "arylene" indicates a group having a valence of 2 or higher formed by the removal of at least two hydrogen atoms from one or more rings of an arene, wherein the hydrogen atoms may be removed from the same or different rings of the arene.

As used herein, when a specific definition is not otherwise provided, the term "alkyl group" refers to a C1 to C30 alkyl group, for example, a C1 to C15 alkyl group, the term "cycloalkyl group" refers to a C3 to C30 cycloalkyl group, for example, a C3 to C18 cycloalkyl group, the term "alkoxy group" refer to a C1 to C30 alkoxy group, for example, a C1 to C18 alkoxy group, the term "ester group" refers to a C2 to C30 ester group, for example, a C2 to C18 ester group, the term "ketone group" refers to a C3 to C30 ketone group, for example, a C3 to C18 ketone group, the term "aryl group" refers to a C6 to C30 aryl group, for example, a C6 to C18 aryl group, the term "alkenyl group" refers to a C2 to C30 alkenyl group, for example, a C2 to C18 alkenyl group, the term "alkynyl group" refers to a C2 to C30 alkynyl group, for example, a C2 to C18 alkynyl group, the term "alkylene group" refers to a C1 to C30 alkylene group, for example, a C1 to C18 alkylene group, and the term "arylene group" refers to a C6 to C30 arylene group, for example, a C6 to C16 arylene group.

As used herein, when a specific definition is not otherwise provided, the term "aliphatic organic group" refers to a C1 to C30 alkyl group, a C2 to C30 alkenyl group, a C2 to C30 alkynyl group, a C1 to C30 alkylene group, a C2 to C30 alkenylene group, or a C2 to C30 alkynylene group, for example, a C1 to C15 alkyl group, a C2 to C15 alkenyl group, a C2 to C15 alkynyl group, a C1 to C15 alkylene group, a C2 to C15 alkenylene group, or a C2 to C15 alkynylene group, the term "alicyclic organic group" refers to a C3 to C30 cycloalkyl group, a C3 to C30 cycloalkenyl group, a C3 to C30 cycloalkynyl group, a C3 to C30 cycloalkylene group, a C3 to C30 cycloalkenylene group, or a C3 to C30 cycloalkynylene group, for example, a C3 to C15 cycloalkyl group, a C3 to C15 cycloalkenyl group, a C3 to C15 cycloalkynyl group, a C3 to C15 cycloalkylene group, a C3 to C15 cycloalkenylene group, or a C3 to C15 cycloalkynylene group.

As used herein when a definition is not otherwise provided, the term "aromatic organic group" refers to a C6 to C30 group including one aromatic ring, two or more aromatic rings fused together to provide a condensed ring system, or two or more moieties independently of the foregoing (a single aromatic ring or a condensed ring system) linked through a single bond or through a functional group such as a fluorenylene group, —O—, —S—, —O(=O)—, —CH(OH)—, —S(=O)$_2$—, —Si(CH$_3$)$_2$—, —(CH$_2$)$_p$— wherein 1≤p≤10, —(CF$_2$)$_q$— wherein 1≤q≤10, —C(CH$_3$)$_2$—, —C(CF$_3$)$_2$—, or —C(=O)NH—, for example, through —S(=O)$_2$—, for example a C6 to C30 aryl group or a C6 to C30 arylene group, for example, a C6 to C16 aryl group or a C6 to C16 arylene group such as phenylene. An example of an aromatic organic group is a fluorenylene group.

As used herein, when a specific definition is not otherwise provided, the term "heterocyclic group" refers to a C2 to C30 heterocycloalkyl group, a C2 to C30 heterocycloalkylene group, a C2 to C30 heterocycloalkenyl group, a C2 to C30 heterocycloalkenylene group, a C2 to C30 heterocycloalkynyl group, a C2 to C30 heterocycloalkynylene group, a C2 to C30 heteroaryl group, or a C2 to C30 heteroarylene group, each including 1 to 3 heteroatoms such as O, S, N, P, Si, or a combination thereof in one ring, for example, a C2 to C15 heterocycloalkyl group, a C2 to C15 heterocycloalkylene group, a C2 to C15 heterocycloalkenyl group, a C2 to C15 heterocycloalkenylene group, a C2 to C15 heterocycloalkynyl group, a C2 to C15 heterocycloalkynylene group, a C2 to C15 heteroaryl group, or a C2 to C15 heteroarylene group, each including 1 to 3 heteroatoms such as O, S, N, P, Si, or a combination thereof, in one ring.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C30 alkyl" refers to a C1 to C30 alkyl group substituted with C6 to C30 aryl group, the total number of carbon atoms in the resulting aryl substituted alkyl group is C7 to C60.

As used herein, when a definition is not otherwise provided, "combination" commonly refers to mixing or copolymerization.

As used herein, when a definition is not otherwise provided, "polyimide" may refer to not only "polyimide" itself which is an imidization product of a polyamic acid, but also "polyamic acid" or a combination of the "polyimide" itself and "polyamic acid". Further, the terms "polyimide" and "polyamic acid" may be understood as the same material.

In addition, in the specification, when a definition is not otherwise provided, the mark "*" may refer to a point of attachment to another atom.

Research efforts directed to converting mobile devices, such as a mobile phone or a tablet personal computer, or the like, to be light, flexible, and bendable are currently ongoing. In this regard, a flexible and transparent window film for a display device having high hardness, for replacing a rigid glass placed on top of the mobile devices, is desired.

To be used as a window film, good optical and mechanical properties are desired. Desired optical properties include high light transmittance, low yellowness index (YI), low YI difference after exposure to UV light, low haze, low refractive index (low reflection index), or the like. Mechanical properties, such as hardness, may be provided by a hard coating layer, but a base film having high toughness may ensure that a final film has high mechanical properties.

A polyimide or poly(amide-imide) copolymer has excellent mechanical, thermal, and optical properties, and thus, is widely used as a plastic substrate for a display device, such as an organic light emitting diode (OLED), liquid crystal display (LCD), or the like. In order to use polyimide or poly(amide-imide) film as a window film for a flexible display device, however, further improved mechanical and optical properties, such as high hardness (or modulus), toughness, high light transmittance, low yellowness index, low refractive index, or the like, are desired. It is difficult, however, to improve both mechanical and optical properties of the film at the same time, as the two properties, especially tensile modulus and yellowness index, of a polyimide or poly(amide-imide) film are in a trade-off relationship with regard to each other, in that improving one of the properties may result in deterioration of the other property.

In an effort to improve mechanical properties of a poly (amide-imide) copolymer film, researchers prepared a poly (amide-imide) copolymer by increasing the amount of an amide structural unit, or by including a dianhydride having a more rigid structure. However, the tensile modulus of such poly(amide-imide) copolymer is barely improved, while optical properties, such as YI, are deteriorated (degraded). In addition, a refractive index of a film prepared from the poly(amide-imide) copolymer may be increased to boost reflection index, or the toughness of the film may reduced.

The inventors of the subject matter of the present application have endeavored to develop a poly(amide-imide) copolymer having good optical properties, such as, for example, high light transmittance and low refractive index, as well as improved tensile modulus, and a composition for preparing the poly(amide-imide). As a result, they have found a new composition for preparing a poly(amide-imide) copolymer including an aromatic tetracarboxylic dianhydride, an aromatic diamine, and an aromatic dicarbonyl compound, as well as an alicyclic diamine including an alicyclic group, for example, a cyclohexylene group, which renders a poly(amide-imide) copolymer having improved mechanical properties, such as, for example, a high tensile modulus, as well as excellent optical properties, such as, for example, a high light transmittance, low yellowness index, low refractive index, or the like. For example, the prepared poly(amide-imide) copolymer may have a light transmittance of greater than or equal to 88.8% in a wavelength range of 350 nanometers (nm) to 750 nm, a yellowness index of less than 2, and a refractive index of less than 1.7. Further, the poly(amide-imide) copolymer may have a tensile modulus of greater than or equal to 5 Gigapascals (GPa).

Accordingly, an embodiment provides a poly(amide-imide) copolymer that is a reaction product of a diamine represented by Chemical Formula 1, a diamine represented by Chemical Formula 2, a dicarbonyl compound represented by Chemical Formula 3, and a tetracarboxylic acid dianhydride represented by Chemical Formula 4:

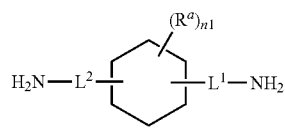

Chemical Formula 1 wherein in Chemical Formula 1,
$R^a$ is a substituted or unsubstituted C1 to C30 aliphatic organic group, a substituted or unsubstituted C3 to C30 alicyclic organic group, a substituted or unsubstituted C6 to C30 aromatic organic group, or a combination thereof,
$L^1$ and $L^2$ are each independently a single bond, a substituted or unsubstituted C1 to C30 aliphatic organic group, a substituted or unsubstituted C3 to C30 alicyclic organic group, a substituted or unsubstituted C6 to C30 aromatic organic group, or a combination thereof, and
n1 is an integer ranging from 0 to 4;

NH$_2$-A-NH$_2$   Chemical Formula 2 wherein in Chemical Formula 2,
A is a ring system including two or more C6 to C30 aromatic rings linked by a single bond, wherein each of the two or more of the aromatic rings is independently unsubstituted or substituted with an electron-withdrawing group;

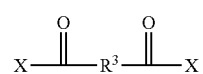

Chemical Formula 3 wherein, in Chemical Formula 3,
$R^3$ is a substituted or unsubstituted phenylene group or a substituted or unsubstituted biphenylene group, and each X is an identical or a different halogen atom.

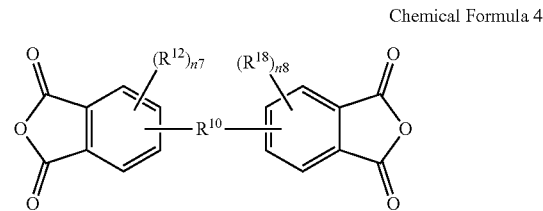

Chemical Formula 4 wherein, in Chemical Formula 4,
$R^{10}$ is a single bond, —O—, —S—, —C(=O)—, —CH(OH)—, —C(=O)NH—, —S(=O)$_2$—, —Si(CH$_3$)$_2$—, —(CH$_2$)$_p$—, —(CF$_2$)$_q$—, —C(C$_n$H$_{2n+1}$)$_2$—, —C(C$_n$F$_{2n+1}$)$_2$—, —(CH$_2$)$_p$C(C$_n$H$_{2n+1}$)$_2$(CH$_2$)$_q$—, or —(CH$_2$)$_p$C(C$_n$F$_{2n+1}$)$_2$(CH$_2$)$_q$— wherein $1 \leq n \leq 10$, $1 \leq p \leq 10$ and $1 \leq q \leq 10$.
$R^{12}$ and $R^{13}$ are each independently a halogen, a hydroxy group, a substituted or unsubstituted C1 to C10 aliphatic organic group, a substituted or unsubstituted C6 to C20 aromatic organic group, a group of formula —OR$^{201}$, wherein R$^{201}$ is a C1 to C10 aliphatic organic group, or a silyl group of formula —SiR$^{210}$R$^{211}$R$^{212}$, wherein R$^{210}$, R$^{211}$, and R$^{212}$ are each independently hydrogen or a C1 to C10 aliphatic organic group,
n7 and n8 are each independently an integer ranging from 0 to 3.

In Chemical Formula 1, $R^a$ may be a substituted or unsubstituted C1 to C30 alkyl group, a substituted or unsubstituted C3 to C30 cycloalkyl group, a substituted or unsubstituted C6 to C30 aryl group, or a combination thereof. For example, $R^a$ may be a substituted or unsubstituted C1 to C30 alkyl group, for example, at least one of C1 to C4 alkyl group, for example, a methyl group, ethyl group, propyl group, butyl group, isopropyl group, isobutyl group, t-butyl group, or the like.

In Chemical Formula 1, $L^1$ and $L^2$ may each independently be a single bond, a substituted or unsubstituted C1 to C30 alkylene group, a substituted or unsubstituted C3 to C30 cycloalkylene group, a substituted or unsubstituted C6 to C30 arylene group, or a combination thereof. For example, $L^1$ and $L^2$ may each independently be a single bond, or a substituted or unsubstituted C1 to C30 alkylene group. In an exemplary embodiment, one of $L^1$ and $L^2$ may be a single bond, and the other one may be a substituted or unsubstituted C1 to C10 alkylene group, for example, a substituted or unsubstituted C1 to C4 alkylene group, such as, for example, methylene group, ethylene group, propylene group, or a butylene group.

In Chemical Formula 1, n1 may be an integer ranging from 0 to 3, for example, an integer ranging from 1 to 3, for example, 2 or 3, and in exemplary example, n1 may be an integer of 3.

The diamine represented by Chemical Formula 1 may be represented by Chemical Formula 1-1:

Chemical Formula 1-1

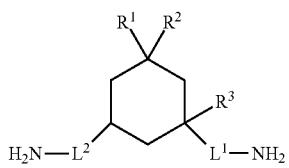

wherein in Chemical Formula 1-1, $R^1$, $R^2$, and $R^3$ are each independently a substituted or unsubstituted C1 to C20 alkyl group, a substituted or unsubstituted C3 to C20 cycloalkyl group, a substituted or unsubstituted C6 to C20 aryl group, or a combination thereof, $L^1$ and $L^2$ are each independently a single bond, a substituted or unsubstituted C1 to C20 alkylene group, a substituted or unsubstituted C3 to C20 cycloalkylene group, a substituted or unsubstituted C6 to C20 arylene group, or a combination thereof.

In Chemical Formula 1-1, $R^1$, $R^2$, and $R^3$ may each independently be a substituted or unsubstituted C1 to C20 alkyl group, for example, an unsubstituted C1 to C10 alkyl group, for example, a C1 to C4 alkyl group, for example, a methyl group, ethyl group, propyl group, isopropyl group, butyl group, isobutyl group, or the like, and are not limited thereto.

In an exemplary embodiment, all of $R^1$, $R^2$, and $R^3$ of Chemical Formula 1-1 may be methyl groups.

In Chemical Formula 1-1, $L^1$ and $L^2$ may each independently be a single bond, a substituted or unsubstituted C1 to C20 alkylene group, for example, one of $L^1$ and $L^2$ may be a single bond, and the other one may be a substituted or unsubstituted C1 to C10 alkylene group, such as, for example, a C1 to C4 alkylene group, for example, methylene group, ethylene group, propylene group, or butylene group.

In an exemplary embodiment, one of $L^1$ and $L^2$ may be a single bond, and the other one may be methylene group, for example, $L^1$ may be methylene group, and $L^2$ may be a single bond, and are not limited thereto.

In an exemplary embodiment, the compound represented by Chemical Formula 1 may be isophorone diamine (IPDA) represented by the following chemical formula:

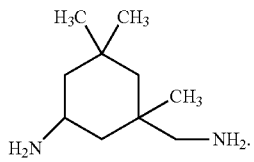

The diamine represented by Chemical Formula 2 may have a ring system including two C6 to C12 aromatic rings linked by a single bond, wherein each of the two C6 to C12 aromatic rings may independently be substituted with a halogen atom, a nitro group, a cyano group, a C1 or C2 haloalkyl group, a C2 to C6 alkanoyl group, or a C2 to C6 ester group.

The compound represented by Chemical Formula 1, for example, the compound represented by Chemical Formula 1-1, for example, the compound, IPDA, may be easily synthesized by a method to known to an ordinary person in the related art, or may be commercially available. For example, IPDA can be commercially available from Hangzhou Dayang Chem. Co. in China.

In an exemplary embodiment, the electron-withdrawing group substituted to each of the aromatic rings of the diamine represented by Chemical Formula 2 may be a halogen atom, —$CF_3$, —$CCl_3$, —$CBr_3$, or —$Cl_3$.

The diamine represented by Chemical Formula 2 may include at least one of the diamines represented by the following chemical formulae:

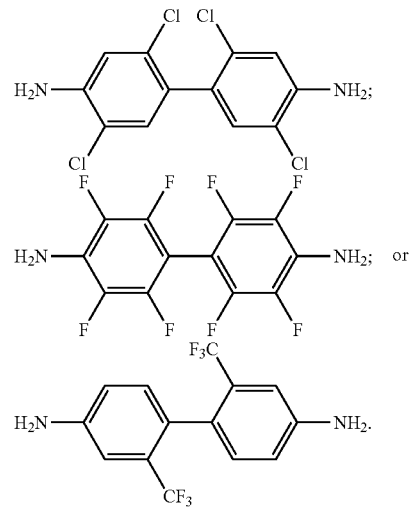

The diamine represented by Chemical Formula 2 may include a diamine represented by Chemical Formula A, i.e., 2,2'-bis(trifluoromethyl)benzidine (TFDB):

Chemical Formula A

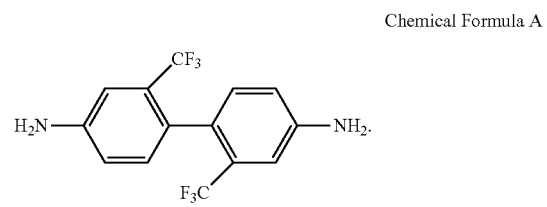 [SMILES: Nc1ccc(-c2ccc(N)cc2C(F)(F)F)c(C(F)(F)F)c1]

In Chemical Formula 3, $R^3$ may be a phenylene group, and each X may be independently Cl or Br.

In an exemplary embodiment, the dicarbonyl compound represented by Chemical Formula 3 may be terephthaloyl dichloride (TPCl).

The tetracarboxylic acid dianhydride represented by Chemical Formula 4 may include at least one of 3,3',4,4'-biphenyl tetracarboxylic dianhydride (BPDA), 3,3',4,4'-diphenylsulfone tetracarboxylic dianhydride (DSDA), 4,4'-(hexafluoroisopropylidene)diphthalic anhydride (6FDA), or 4,4'-oxydiphthalic anhydride (ODPA), and is not limited thereto.

In an exemplary embodiment, the tetracarboxylic acid dianhydride represented by Chemical Formula 4 may be a combination of the compound represented by Chemical Formula 4 wherein $R^{10}$ is a single bond, and both n7 and n8 are 0, for example, 3,3',4,4'-biphenyl tetracarboxylic dianhydride (BPDA), and the compound represented by Chemical Formula 4 wherein $R^{10}$ is —$C(C_nF_{2n+1})_2$— wherein 1 and both n7 and n8 are 0, for example, 4,4'-(hexafluoroisopropylidene)diphthalic anhydride (6FDA).

At least one of the diamine represented by Chemical Formula 1 and the diamine represented by Chemical Formula 2 may react with a dicarbonyl compound represented by Chemical Formula 3 to provide an amide structural unit in a poly(amide-imide) copolymer, and at least one of the diamine represented by Chemical Formula 1 and the diamine represented by Chemical Formula 2 may react with a tetracarboxylic acid dianhydride represented by Chemical Formula 4 to provide an imide structural unit in a poly(amide-imide) copolymer.

A conventional method for preparing a poly(amide-imide) copolymer may include preparing an amide structural unit by reacting a dicarbonyl compound represented by Chemical Formula 3, such as, for example, a dicarbonyl chloride, with at least one diamine represented by Chemical Formula 2, and further adding and reacting an additional diamine, such as, for example, a diamine represented by Chemical Formula 2 with a tetracarboxylic acid dianhydride, for example, a tetracarboxylic acid dianhydride represented by Chemical Formula 4 to prepare an amic acid structural unit with the diamine and the tetracarboxylic acid dianhydride, as well as to link the prepared amide structural unit and the amic acid structural unit to provide a poly(amide-amic acid) copolymer. Thus, the prepared poly(amide-amic acid) copolymer may be partially or completely imidized by a chemical and/or thermal imidization reaction. Then, the obtained poly(amide-amic acid and/or imide) copolymer may be precipitated, filtered, and/or further heat-treated to provide a final poly(amide-imide) copolymer. These methods are well known to persons skilled in the art to which the present inventive concept pertains.

However, a poly(amide-imide) copolymer according to an embodiment may be prepared by incorporating a diamine represented by Chemical Formula 1 into the reactants used in the above-mentioned conventional method. The poly(amide-imide) copolymer according to an embodiment may include an amide structural unit represented by at least one of Chemical Formula 7 and Chemical Formula 8, and an imide structural unit represented by at least one of Chemical Formula 9 and Chemical Formula 10, provided that the poly(amide-imide) copolymer is not consisting of an amide structural unit represented by Chemical Formula 7 and an imide structural unit represented by Chemical Formula 9, or of an amide structural unit represented by Chemical Formula 8 and an imide structural unit represented by Chemical Formula 10.

An amide structural unit prepared by reacting a diamine represented by Chemical Formula 1 and a dicarbonyl compound represented by Chemical Formula 3 may be represented by Chemical Formula 7, and an amide structural unit prepared by reacting a diamine represented by Chemical Formula 2 and a dicarbonyl compound represented by Chemical Formula 3 may be represented by Chemical Formula 8:

Chemical Formula 7

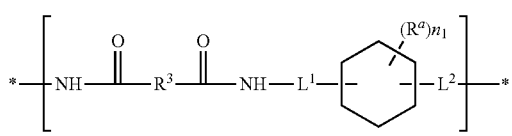

wherein in Chemical Formula 7,
R³ is the same as defined for Chemical Formula 3, and each of $R^a$, $L^1$, $L^2$, and n1 is the same as defined for Chemical Formula 1, Chemical Formula 8

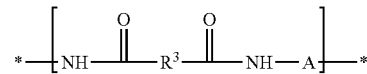

wherein in Chemical Formula 8,
R³ is the same as defined for Chemical Formula 3, and A is the same as defined for Chemical Formula 2.

An imide structural unit prepared by reacting a diamine represented by Chemical Formula 1 and a tetracarboxylic acid dianhydride represented by Chemical Formula 4 may be represented by Chemical Formula 9, and an imide structural unit prepared by reacting a diamine represented by Chemical Formula 2 and a tetracarboxylic acid dianhydride represented by Chemical Formula 4 may be represented by Chemical Formula 10:

Chemical Formula 9

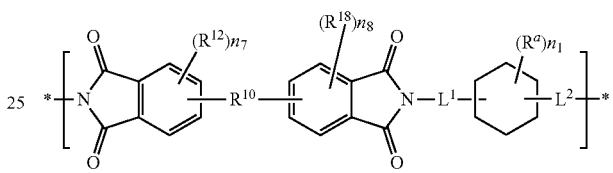

wherein in Chemical Formula 9,
$R^{10}$, $R^{12}$, $R^{13}$, n7 and n8 are the same as defined for Chemical Formula 4, and each of $R^a$, $L^1$, $L^2$, and n1 are the same as defined for Chemical Formula 1;

Chemical Formula 10

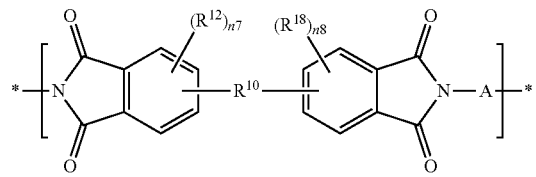

wherein in Chemical Formula 10,
$R^{10}$, $R^{12}$, $R^{13}$, n7 and n8 are the same as defined for Chemical Formula 4, and A is the same as defined for Chemical Formula 2.

The diamine represented by Chemical Formula 1 may be included in an amount of less than or equal to 50 mole percent (mole %), for example, from about 1 mole % to about 50 mole %, for example, from about 5 mole % to about 50 mole %, for example, from about 5 mole % to about 45 mole %, for example, from about 5 mole % to about 40 mole %, for example, from about 7 mole % to about 45 mole %, for example, from about 7 mole % to about 40 mole %, for example, from about 10 mole % to about 45 mole %, for example, from about 10 mole % to about 40 mole %, for example, from about 10 mole % to about 35 mole %, for example, from about 15 mole % to about 45 mole %, for example, from about 15 mole % to about 40 mole %, or for example, from about 15 mole % to about 35 mole %, based on the total amount of the diamines represented by Chemical Formula 1 and the diamine represented by Chemical Formula 2.

By including the diamine represented by Chemical Formula 1 and the diamine represented by Chemical Formula 2 in an amount within the above range and reacting them with a dicarbonyl compound represented by Chemical Formula 3 and a tetracarboxylic acid dianhydride represented by Chemical Formula 4, thus prepared poly(amide-imide) copolymer may have excellent optical properties, such as, for example, a high light transmittance and a low yellowness index (YI), and a low refractive index, as well as good mechanical properties, such as, for example, a high tensile modulus.

For example, an article including the poly(amide-imide) copolymer, for example, a film having a thickness of about 50 micrometers (μms) may have a light transmittance of greater than or equal to about 88.8%, for example, greater than or equal to about 89%, for example, greater than or equal to about 89.3%, for example, greater than or to equal to about 89.4%, for example, greater than or equal to about 89.5%, for example, greater than or equal to about 89.7%, at a wavelength range of from 350 nm to 750 nm, Further, an article including the poly(amide-imide) copolymer, for example, a film having a thickness of about 50 micrometers (μms) may have a YI of less than 2, for example, less than or equal to 1.95, for example, less than or equal to 1.9, for example, less than or equal to 1.85, or for example, less than or equal to 1.84. For example, the film may have a refractive index of less than 1.7, for example, less than or equal to 1.68, for example, less than or equal to 1.67, for example, less than or equal to 1.65, for example, less than or equal to 1.64, or for example, less than or equal to 1.63.

For example, an article including the poly(amide-imide) copolymer, for example, a film having a thickness of about 50 micrometers (μms) may have a tensile modulus of greater than or equal to 5 GPa, for example, greater than or equal to 5.1 GPa, for example, greater than or equal to 5.2 GPa, for example, greater than or equal to 5.3 GPa, for example, greater than or equal to 5.4 GPa, for example, greater than or equal to 5.5 GPa, for example, greater than or equal to 5.6 GPa, for example, greater than or equal to 5.7 GPa, for example, greater than or equal to 5.8 GPa, for example, greater than or equal to 5.9 GPa, for example, greater than or equal to 6.0 GPa, or for example, greater than or equal to 6.1 GPa.

Further, the film may have a low YI difference after and before exposure to UV (ΔUV), for example, less than 1.0, and thus, have high stability to UV.

As shown from the later-described Examples and Comparative Examples, the poly(imide-amide) copolymer according to Comparative Example 1, which is prepared by an aromatic diamine, an aromatic dianhydride, and an aromatic dicarbonyl compound, without an alicyclic diamine represented by Chemical Formula 1, has a relatively high tensile modulus of about 6, while it has a relatively low light transmittance of 88.6% at a wavelength range of from 350 nm to 750 nm, a YI of 2.48, and a refractive index of about 1.7, which exhibits deteriorated optical properties compared with the poly(amide-imide) copolymer according to an embodiment. When about 10 mole % of the diamine represented by Chemical Formula 1 is included based on the total amount of diamines, the poly(amide-imide) copolymer prepared from a composition including the diamine exhibits a tensile modulus of about 5.8, which is a little lower than the poly(amide-imide) copolymer that does not include the diamine, a remarkably reduced YI of 1.84, an improved light transmittance, and a lowered refractive index. That is, the poly(amide-imide) copolymer may have greatly improved optical properties, while maintaining good mechanical properties. Further, when 22 mole % of the diamine represented by Chemical Formula 1 is included based on the total amount of diamines, the poly(amide-imide) copolymer prepared from a composition including the diamine exhibits a greatly improved tensile modulus of 6.1, a lowered refractive index of 1.62, an improved light transmittance, a lowered YI of less than 2, or the like, and thus showing both of the optical and mechanical properties simultaneously improved. In fact, as the amount of the diamine represented by Chemical Formula 1 increases exceeding 20 mole % based on the total amount of the diamines, the poly(amide-imide) copolymer exhibits greatly improved optical properties, such as, for example, a further enhanced light transmittance, further lowered YI and refractive index, or the like, while maintaining good mechanical properties, such as, for example, at least 5 GPa of the tensile modulus, which meets requirements of mechanical properties as a window film. As such, it is noted that the poly(amide-imide) copolymer prepared by using an alicyclic diamine represented by Chemical Formula 1, along with an aromatic diamine, exhibits improved optical properties, while maintaining good mechanical properties, compared with a poly(amide-imide) copolymer prepared by not including the alicyclic diamine. Therefore, the poly(amide-imide) copolymer according to an embodiment may improve both the optical and mechanical properties, which are often in a counter or trade-off relationship, and thus not easy to simultaneously improve.

Under the condition that the amount of the diamine represented by Chemical Formula 1 and the diamine represented by Chemical Formula 2 is in the above identified ratio, the dicarbonyl compound represented by Chemical Formula 3 and the tetracarboxylic acid dianhydride represented by Chemical Formula 4 may be included in a mole ratio of 30 to 70:70 to 30, for example, 35 to 65:65 to 35, for example, 40 to 60:60 to 40, for example, 45 to 55:55 to 45, for example, 50:50. By including the dicarbonyl compound represented by Chemical Formula 3 and the tetracarboxylic acid dianhydride represented by Chemical Formula 4 in the above ratio, the poly(amide-imide) copolymer prepared therefrom may maintain good mechanical properties, as well as excellent optical properties.

As described above, a dicarbonyl compound represented by Chemical Formula 3 may react with a diamine represented by Chemical Formula 1 and/or a diamine represented by Chemical Formula 2 to prepare an amide structural unit of a poly(amide-imide) copolymer, while a tetracarboxylic acid dianhydride represented by Chemical Formula 4 may react with a diamine represented by Chemical Formula 1 and/or a diamine represented by Chemical Formula 2 to prepare an imide structural unit of a poly(amide-imide) copolymer. In the prior art, an amide structural unit is known to increase mechanical properties of a poly(amide-imide) copolymer, and thus, in order to improve mechanical properties of a poly(amide-imide) copolymer efforts have been made to increase an amount of the amide structural unit in a poly(amide-imide) copolymer. However, according to an embodiment, by reacting a dicarbonyl compound represented by Chemical Formula 3 with a tetracarboxylic acid dianhydride represented by Chemical Formula 4 in the above mole ratio, thus prepared poly(amide-imide) copolymer may have excellent optical properties, such as, for example, an enhanced light transmittance, a lowered YI, and a lowered refractive index, while maintaining good mechanical properties, such as, for example, at least a certain degree of a tensile modulus, such as, for example, at least 5 GPa.

The total amount of the diamine represented by Chemical Formula 2 and the dicarbonyl compound represented by Chemical Formula 3 may be equal to or greater than 50 mole % based on the total amount of the compounds represented by Chemical Formulae 1 to 4. For example, the total amount of the diamine represented by Chemical Formula 2 and the dicarbonyl compound represented by Chemical Formula 3 may be equal to or greater than 50 mole %, for example, equal to or greater than 55 mole %, for example, equal to or greater than 60 mole %, for example, equal to or greater than 65 mole %, for example, equal to or greater than 70 mole %, for example, equal to or greater than 75 mole %, for example, equal to or greater than 80 mole % based on the total amount of the compounds represented by Chemical Formulae 1 to 4.

An aromatic diamine represented by Chemical Formula 2 may have a more rigid structure than a diamine represented by Chemical Formula 1, as the two or more aromatic rings of the diamine represented by Chemical Formula 2 are linked by a single bond, whereas the diamine represented by Chemical Formula 1 has a cyclohexylene group between two amino groups, or between a substituted or unsubstituted C1 to C30 aliphatic organic group, a substituted or unsubstituted C3 to C30 alicyclic organic group, a substituted or unsubstituted C6 to C30 aromatic organic group, or a combination thereof. Further, the dicarbonyl compound represented by Chemical Formula 3 may have a rigid structure, and thus, by including a diamine represented by Chemical Formula 2 and a dicarbonyl compound represented by Chemical Formula 3, both of which have rigid structure, in an amount of greater than or equal to 50 mole % based on the total components for preparing a poly(amide-imide) copolymer according to an embodiment, the prepared poly(amide-imide) copolymer may have good mechanical properties, for example, a high tensile modulus.

In addition, the tetracarboxylic acid dianhydride represented by Chemical Formula 4 may be a combination of the compound represented by Chemical Formula 4 wherein $R^{10}$ is a single bond, and both n7 and n8 are 0, and the compound represented by Chemical Formula 4 wherein $R^{10}$ is —C($C_nF_{2n+1}$)$_2$— wherein 1≤n≤10, and both n7 and n8 are 0, in a mole ratio of 1:5 to 6:1, for example, 1:5 to 5:1, for example, 1:4.5 to 5:1, for example, 1:4 to 4.5:1, for example, 1:3.5 to 4.5:1, for example, 1:3.5 to 4:1, for example, 1:3 to 3.5:1, for example, 1:2 to 3:1, for example, 1:2 to 2:1, for example, 1:1.5 to 1.5:1, or for example, 1:1. In an exemplary embodiment, the tetracarboxylic acid dianhydride represented by Chemical Formula 4 may be a combination of 3,3',4,4'-biphenyl tetracarboxylic dianhydride (BPDA) and 4,4'-(hexafluoroisopropylidene)diphthalic anhydride (6FDA), and in this case, by including BPDA and 6FDA in the above ratio, the prepared poly(amide-imide) copolymer may have good optical properties, as well as improved mechanical properties.

When $R^{10}$ is a single bond in the tetracarboxylic acid dianhydride represented by Chemical Formula 4, the tetracarboxylic acid dianhydride has a much more rigid structure than those having different groups as $R^{10}$. It has been known that as the amount of the tetracarboxylic acid dianhydride having a rigid structure increases, mechanical properties of the prepared poly(amide-imide) copolymer also increases or improves.

As described above, the poly(amide-imide) copolymer according to an embodiment is prepared by including the diamine represented by Chemical Formula 1, and thus, it exhibits remarkably improved optical properties, such as, for example, a light transmittance, refractive index, yellowness index, or the like, while maintaining good mechanical properties, compared with a poly(amide-imide) copolymer prepared not including the diamine. Accordingly, the poly(amide-imide) copolymer according to an embodiment may be advantageous for a use in a display device, such as, for example, as a window film for a flexible display device, which requires a further enhanced mechanical and optical properties.

Another embodiment provides a composition for preparing a poly(amide-imide) copolymer including a diamine represented by Chemical Formula 1, a tetracarboxylic acid dianhydride represented by Chemical Formula 4, and a diamine represented by Chemical Formula 5:

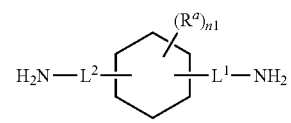

Chemical Formula 1 wherein in Chemical Formula 1, $R^a$ is a substituted or unsubstituted C1 to C30 aliphatic organic group, a substituted or unsubstituted C3 to C30 alicyclic organic group, a substituted or unsubstituted C6 to C30 aromatic organic group, or a combination thereof, $L^1$ and $L^2$ are each independently a single bond, a substituted or unsubstituted C1 to C30 aliphatic organic group, a substituted or unsubstituted C3 to C30 alicyclic organic group, a substituted or unsubstituted C6 to C30 aromatic organic group, or a combination thereof, and n1 is an integer ranging from 0 to 4;

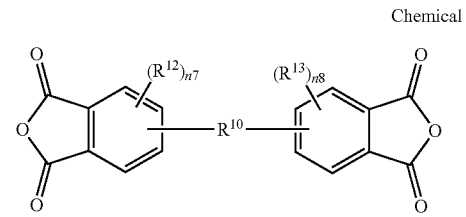

Chemical Formula 4 wherein, in Chemical Formula 4, $R^{10}$ is a single bond, —O—, —S—, —C(=O)—, —CH(OH)—, —C(=O)NH—, —S(=O)$_2$—, —Si(CH$_3$)$_2$—, —(CH$_2$)$_p$—, —(CF$_2$)$_q$—, —C(C$_n$H$_{2n+1}$)$_2$—, —C(C$_n$F$_{2n+1}$)$_2$—, —(CH$_2$)$_p$C(C$_n$H$_{2n+1}$)$_2$(CH$_2$)$_q$—, or —(CH$_2$)$_p$C(C$_n$F$_{2n+1}$)$_2$(CH$_2$)$_q$— wherein 1≤n≤10, 1≤p≤10, and 1≤q≤10, $R^{12}$ and $R^{13}$ are each independently a halogen, a hydroxy group, a substituted or unsubstituted C1 to C10 aliphatic organic group, a substituted or unsubstituted C6 to C20 aromatic organic group, a group of formula —OR$^{201}$, wherein R$^{201}$ is a C1 to C10 aliphatic organic group, or a silyl group of formula —SiR$^{210}$R$^{211}$R$^{212}$, wherein R$^{210}$, R$^{211}$, and R$^{212}$ are each independently hydrogen or a C1 to C10 aliphatic organic group, and n7 and n8 are each independently an integer ranging from 0 to 3;

Chemical Formula 5

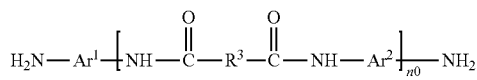

wherein, in Chemical Formula 5,
$R^3$ is a substituted or unsubstituted phenylene group or a substituted or unsubstituted biphenylene group,
n0 is an integer of greater than or equal to 1, and
$Ar^1$ and $Ar^2$ are, each independently, represented by Chemical Formula 6:

Chemical Formula 6

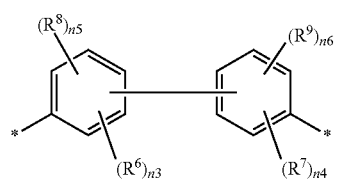

wherein, in Chemical Formula 6,
$R^6$ and $R^7$ are each independently —$CF_3$, —$CCl_3$, —$CBr_3$, —$Cl_3$, —$NO_2$, —CN, —C(=O)$CH_3$, or —$CO_2C_2H_5$,
$R^8$ and $R^9$ are each independently a halogen, a hydroxy group, a substituted or unsubstituted C1 to C10 aliphatic organic group, a substituted or unsubstituted C6 to C20 aromatic organic group, a group of formula —$OR^{204}$ wherein $R^{204}$ is a C1 to C10 aliphatic organic group, or a silyl group of formula —$SiR^{205}R^{206}R^{207}$ wherein $R^{205}$, $R^{206}$, and $R^{207}$ are each independently hydrogen or a C1 to C10 aliphatic organic group,
n3 is an integer ranging from 1 to 4, n5 is an integer ranging from 0 to 3, provided that n3+n5 is an integer ranging from 1 to 4, and
n4 is an integer ranging from 1 to 4, n6 is an integer ranging from 0 to 3, provided that n4+n6 is an integer ranging from 1 to 4.

As described above, in a conventional method for preparing a poly(amide-imide) copolymer, an amide structural unit may first be prepared by a reaction of a dicarbonyl compound and a diamine, and then an additional diamine and a dianhydride compound are added to the reactor to prepare an amic acid structural unit. Further, as soon as the amic acid structural unit is prepared, the prepared amide structural unit and the amic acid structural unit are linked to prepare a poly(amide-imide) copolymer. Meanwhile, in the process of preparing the amide structural unit, a by-product, such as halogenated hydrogen (HX: 'H' indicates hydrogen, and 'X' indicates halogen), for example, hydrogen chloride (HCl), is problematically produced. The hydrogen chloride by-product causes corrosion of an element of an apparatus, and thus, should be removed by a precipitation process. In order to remove the by-product, an HX scavenger, such as a tertiary amine, may be added to the reactor, whereby a salt of HX is produced (please see Reaction Scheme 1 below). If the produced salt of HX is not removed and a film is produced therefrom, serious deterioration of optical properties of the produced film occurs. Therefore, a precipitation process to remove the salt of HX is required in the conventional method for preparing poly(amide-imide) copolymer. The precipitation process increases total process time and cost, while reducing the yield of the final poly(amide-imide) copolymer produced therefrom.

Reaction Scheme 1

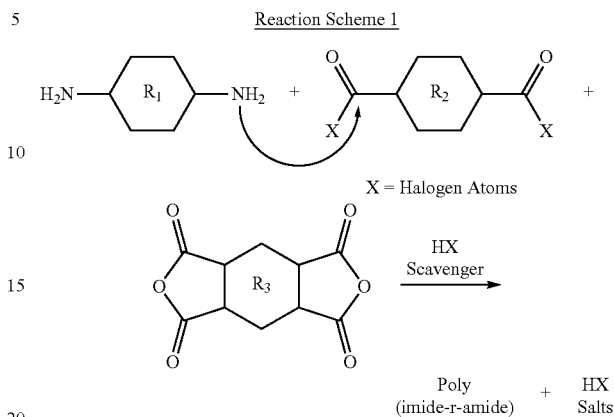

In addition to using the conventional method including the precipitation process as described above, it is also possible to prepare a poly(amide-imide) copolymer according to an embodiment by first reacting a diamine and a dicarbonyl compound to prepare an amide structural unit-containing oligomer having amino groups at both ends thereof (hereinafter, referred to as "an amide structural unit-containing oligomer"), and then reacting the prepared amide structural unit-containing oligomer as a diamine monomer with a tetracarboxylic acid dianhydride to provide a poly(amide-imide) copolymer. According to the new method for preparing a poly(amide-imide) copolymer, the precipitation process for removing the HX salt may be omitted, and thus, not only the total process time and cost may be reduced, but also the yield of the final poly(amide-imide) copolymer may increase. Further, it is also possible to obtain a poly(amide-imide) copolymer including a higher amount of an amide structural unit than those prepared by using the conventional method, and thus, an article prepared from the poly(amide-imide) copolymer, for example, a film, may have further improved mechanical properties, while maintaining good optical properties.

Accordingly, another embodiment provides a composition for preparing a poly(amide-imide) copolymer including an amide structural unit-containing oligomer represented by Chemical Formula 5 as a diamine monomer, which may be prepared by reacting a diamine and a dicarbonyl compound, a tetracarboxylic acid dianhydride represented by Chemical Formula 4 for reacting with the oligomer to provide an imide structural unit, and as an additional diamine, a diamine represented by Chemical Formula 1 for reacting with the tetracarboxylic acid dianhydride represented by Chemical Formula 4 to provide an imide structural unit.

The diamine represented by Chemical Formula 5 may be prepared by reacting a dicarbonyl compound represented by Chemical Formula 3, and a diamine represented by Chemical Formula 2, wherein the diamine represented by Chemical Formula 2 may be added in a greater molar amount than the dicarbonyl compound represented by Chemical Formula 3 to provide an oligomer having amino groups at both ends thereof. In this case, there may be remaining diamine that did not react with the dicarbonyl compound. The unreacted diamine, i.e., the diamine represented by Chemical Formula 2 may react with a tetracarboxylic acid dianhydride represented by Chemical Formula 4 along with the diamine represented by Chemical Formula 5, which is an oligomer-like diamine, to prepare an imide structural unit. Accordingly, in an exemplary embodiment, the composition may further include the diamine represented by Chemical Formula 2.

Descriptions of the compounds represented by Chemical Formulae 1 to 4 are the same as those described above for the poly(amide-imide) copolymer according to an embodiment, and thus, a more detailed description of the compounds is omitted here.

In an exemplary embodiment, the diamine represented by Chemical Formula 1-1 is as below, which is also the same as described above.

Chemical Formula 1-1

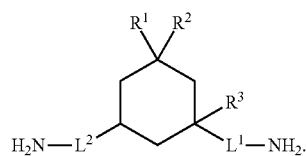

In an exemplary embodiment, the diamine represented by Chemical Formula 2 may include at least one of the diamines represented by the following chemical formulae:

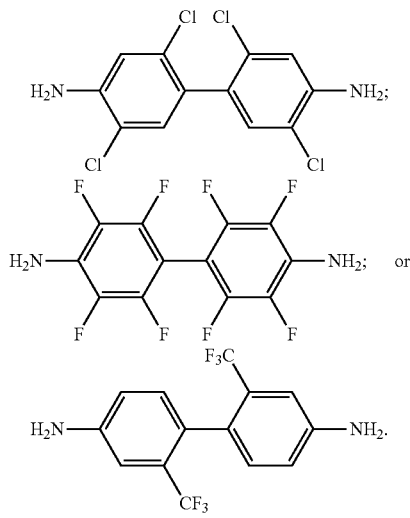

The diamine represented by Chemical Formula 2 may include a diamine represented by Chemical Formula A, i.e., 2,2'-bis(trifluoromethyl)benzidine (TFDB):

Chemical Formula A

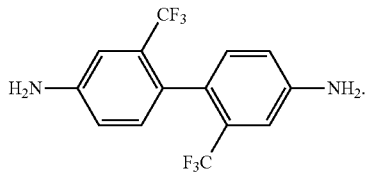

The tetracarboxylic acid dianhydride represented by Chemical Formula 4 may be a combination of the compound represented by Chemical Formula 4-1 and the compound represented by Chemical Formula 4-2, but is not limited thereto:

Chemical Formula 4-1

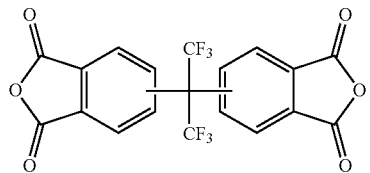

Chemical Formula 4-2

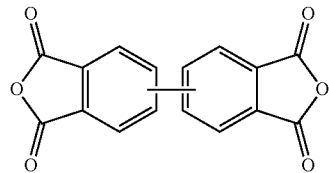

The compound represented by Chemical Formula 4-1 may be 6FDA, the compound represented by Chemical Formula 4-2 may be at least one of s-BPDA, a-BPDA, or i-BPDA, and in an exemplary embodiment, the compound represented by Chemical Formula 4-2 may be s-BPDA.

In an exemplary embodiment, $R^3$ of the compound represented by Chemical Formula 5 may be a substituted or unsubstituted phenylene group, and both of $Ar^1$ and $Ar^2$ may be represented by Chemical Formula 6:

Chemical Formula 6

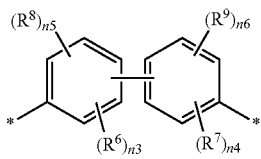

wherein, in Chemical Formula 6, $R^6$ and $R^7$ are each independently —$CF_3$, —$CBr_3$, —$Cl_3$, —$NO_2$, —CN, —C(=O)$CH_3$, and —$CO_2C_2H_5$, and for example, both of them may be —$CF_3$, and both of n3 and n4 may be 1, and both of n5 and n6 may be 0 (zero).

After preparing a poly(amide-imide) copolymer from the composition, an article may be formed from the poly(amide-imide) copolymer through a dry-wet method, a dry method, or a wet method, but is not limited thereto. When the article is a film, it may be manufactured using a solution including the composition through the dry-wet method, wherein a layer is formed by extruding the solution of the composition from, e.g., a die, onto a support, such as drum or an endless belt, drying the layer by evaporating the solvent from the layer until the layer has a consistent property, such as a consistent weight. The drying may be performed by heating, for example, from about 25° C. to about 150° C., within about 1 hour or less. Then, the dried layer may be heated from the room temperature to about 200° C. or to about 300° C. at a heating rate of about 10° C. per minute, and then be allowed to stand at the heated temperature for about 5 minutes to about 30 minutes to obtain a poly(amide-imide)-based film.

When the surface of the drum and/or the endless belt used for the drying process is flat, a layer with a flat surface is formed. The layer obtained after the drying process is delaminated from the support, and subjected to a wet process, desalted, and/or desolventized (i.e., solvent further removed). The manufacturing of the film is completed after the layer is elongated, dried, and/or heat treated. The heat treatment may be performed at about 200° C. to about 500° C., for example, at about 250° C. to about 400° C., for several seconds to several minutes. After the heat treatment, the layer may be cooled slowly, for example, at a cooling rate of less than or equal to about 50° C. per minute.

The layer may be formed as a single layer or multiple layers.

When prepared as a film, the film may have a yellowness index (YI) of less than 2 at a thickness of about 35 micrometers (μm) to about 100 μm measured according to an ASTM D1925 method, a light transmittance of greater than or equal to 88.8% in a wavelength range of 350 nanometers (nm) to 750 nm, and a refractive index of less than 1.7, which shows excellent optical properties. Further, the film has a tensile modulus of greater than or equal to 5 GPa, which exhibits good mechanical properties.

Thus, the article may maintain good mechanical properties of a poly(amide-imide) copolymer, such as, for example, a high tensile modulus, and it may have excellent optical properties, such as, for example, a greatly lowered YI, and a lowered refractive index, and thus, may be advantageous for a use as a window film for a flexible display device.

Hereafter, the technology of this disclosure is described in detail with reference to examples. The following examples and comparative examples are not restrictive but are illustrative only.

EXAMPLES

Synthesis Example 1: Preparation of an Oligomer Containing 70 Mole Percent (Mole %) of an Amide Structural Unit as a Diamine Monomer An amide structural unit-containing oligomer, as a diamine monomer, is prepared by reacting TPCl and 2,2'-bis(trifluoromethyl)benzidine (TFDB), in accordance with Reaction Scheme 2:

(0.086 mole, 17.4 g) of terephthaloyl chloride (TPCl) is divided into 4 portions, which are individually added, each portion at a time, to be mixed with the TFDB solution. The mixture is then vigorously stirred and reacted for 15 minutes at room temperature.

The resultant solution is further stirred under a nitrogen atmosphere for 2 hours, and then added to 7 liters of water containing 350 g of NaCl. The resulting mixture is stirred for 10 minutes. Subsequently, a solid produced therein is filtered, re-suspended twice by using 5 liters (L) of deionized water, and then re-filtered. The water remaining in the final product on the filter is removed to the extent possible by thoroughly pressing the filtered precipitate on a filter. The precipitate is then dried at 90° C. under vacuum for 48 hours, to obtain an amide structural unit-containing oligomer represented in Reaction Scheme 2, as a diamine monomer, as a final product. The prepared oligomer containing 70 mole % of amide structural unit has a number average molecular weight of about 997 grams per mole (g/mole).

Examples and Comparative Example: Preparation of Poly(Amide-Imide) copolymer films Example 1

84 grams of N,N-dimethyl acetamide (DMAc) as a solvent is charged into a double-walled 250 mL reactor, preheated to 25° C., and equipped with a mechanical stirrer and a nitrogen inlet. Then, 6.72 g (0.0048 mol) of the 70 mole % of amide structural unit-containing oligomer prepared in Synthesis Example 1, 0.26 g (0.0008 mol) of 2,2'-bis(trifluoromethyl)benzidine (TFDB), and 1.92 g (0.011 mol) of isophorone diamine (IPDA) are added thereto and dissolved, and the temperature is set to 25° C. Then, 0.83 g (0.0028 mol) of 3,3',4,4'-biphenyltetracarboxylic dianhydride (BPDA), and 6.26 g (0.014 mol) of 4,4'-(hexafluoroisopropylidene)diphthalic anhydride (6FDA) are added thereto, and the mixture is stirred for 48 hours. Then, 1.34 g of pyridine and 5.18 g of acetic anhydride are added thereto,

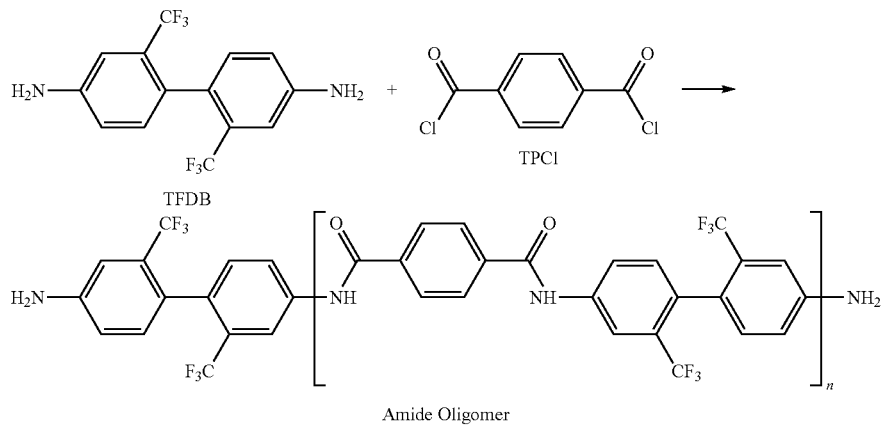

Reaction Scheme 2

That is, 1 mole equivalent (0.122 mole, 39.2 grams) of 2,2'-bis(trifluoromethyl)benzidine (TFDB) and 2.8 mole equivalent (0.343 mole, 27.11 grams) of pyridine are dissolved in 700 grams (g) of N,N-dimethyl acetamide (DMAc) as a solvent in a round-bottomed flask, and 50 milliliters (mL) of DMAC is further added to the flask to dissolve the remaining TFDB. Then, 0.7 mole equivalent and the mixture is stirred for 24 hours to obtain a poly(amic acid-amide) copolymer solution, of which the solid content is 15 weight percent (wt %).

After cooling the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Example 2

84 grams of N,N-dimethyl acetamide (DMAc) as a solvent is charged into a double-walled 250 mL reactor, preheated to 25° C., and equipped with a mechanical stirrer and a nitrogen inlet. Then, 7.09 g (0.005 mol) of the 70 mole % of amide structural unit-containing oligomer prepared in Synthesis Example 1, 0.27 g (0.0008 mol) of 2,2'-bis(trifluoromethyl)benzidine (TFDB), and 2.0 g (0.011 mol) of isophorone diamine (IPDA) are added thereto and dissolved, and the temperature is set to 25° C. Then, 2.62 g (0.008 mol) of 3,3',4,4'-biphenyltetracarboxylic dianhydride (BPDA), and 3.96 g (0.008 mol) of 4,4'-(hexafluoroisopropylidene) diphthalic anhydride (6FDA) are added thereto, and the mixture is stirred for 48 hours. Then, 1.41 g of pyridine and 5.47 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the solution is cast on a glass substrate, and dried for 40 minutes on a hot plate at a temperature of 100° C. Then, the film is separated from the glass substrate and introduced into a furnace, wherein the temperature is increased from the room temperature to 230° C., at a heating rate of 10° C. per minutes, maintained at 230° C. for about 20 minutes, and slowly cooled to room temperature to obtain a poly(amide-imide) copolymer film.

Example 3

84 grams of N,N-dimethyl acetamide (DMAc) as a solvent is charged into a double-walled 250 mL reactor, preheated to 25° C., and equipped with a mechanical stirrer and a nitrogen inlet. Then, 7.64 g (0.005 mol) of the 70 mole % of amide structural unit-containing oligomer prepared in Synthesis Example 1, 0.06 g (0.002 mol) of 2,2'-bis(trifluoromethyl)benzidine (TFDB), and 1.69 g (0.009 mol) of isophorone diamine (IPDA) are added thereto and dissolved, and the temperature is set to 25° C. Then, 0.71 g (0.002 mol) of 3,3',4,4'-biphenyltetracarboxylic dianhydride (BPDA), and 5.88 g (0.013 mol) of 4,4'-(hexafluoroisopropylidene) diphthalic anhydride (6FDA) are added thereto, and the mixture is stirred for 48 hours. Then, 1.24 g of pyridine and 4.8 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Example 4

84 grams of N,N-dimethyl acetamide (DMAc) as a solvent is charged into a double-walled 250 mL reactor, preheated to 25° C., and equipped with a mechanical stirrer and a nitrogen inlet. Then, 8.52 g (0.006 mol) of the 70 mole % of amide structural unit-containing oligomer prepared in Synthesis Example 1, 0.32 g (0.001 mol) of 2,2'-bis(trifluoromethyl)benzidine (TFDB), and 1.21 g (0.007 mol) of isophorone diamine (IPDA) are added thereto and dissolved, and the temperature is set to 25° C. Then, 0.84 g (0.002 mol) of 3,3',4,4'-biphenyltetracarboxylic dianhydride (BPDA), and 5.08 g (0.011 mol) of 4,4'-(hexafluoroisopropylidene) diphthalic anhydride (6FDA) are added thereto, and the mixture is stirred for 48 hours. Then, 1.13 g of pyridine and 4.38 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the to solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Example 5

84 grams of N,N-dimethyl acetamide (DMAc) as a solvent is charged into a double-walled 250 mL reactor, preheated to 25° C., and equipped with a mechanical stirrer and a nitrogen inlet. Then, 8.88 g (0.006 mol) of the 70 mole % of amide structural unit-containing oligomer prepared in Synthesis Example 1, 0.33 g (0.001 mol) of 2,2'-bis(trifluoromethyl)benzidine (TFDB), and 1.27 g (0.007 mol) of isophorone diamine (IPDA) are added thereto and dissolved, and the temperature is set to 25° C. Then, 2.19 g (0.007 mol) of 3,3',4,4'-biphenyltetracarboxylic dianhydride (BPDA), and 3.31 g (0.007 mol) of 4,4'-(hexafluoroisopropylidene) diphthalic anhydride (6FDA) are added thereto, and the mixture is stirred for 48 hours. Then, 1.18 g of pyridine and 4.57 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Example 6

84 grams of N,N-dimethyl acetamide (DMAc) as a solvent is charged into a double-walled 250 mL reactor, preheated to 25° C., and equipped with a mechanical stirrer and a nitrogen inlet. Then, 9.84 g (0.007 mol) of the 70 mole % of amide structural unit-containing oligomer prepared in Synthesis Example 1, 0.13 g (0.00047 mol) of 2,2'-bis(trifluoromethyl)benzidine (TFDB), and 1.02 g (0.006 mol) of isophorone diamine (IPDA) are added thereto and dissolved, and the temperature is set to 25° C. Then, 1.98 g (0.006 mol) of 3,3',4,4'-biphenyltetracarboxylic dianhydride (BPDA), and 3.0 g (0.006 mol) of 4,4'-(hexafluoroisopropylidene)diphthalic anhydride (6FDA) are added thereto, and the mixture is stirred for 48 hours. Then, 1.07 g of pyridine and 4.147 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Example 7

84 grams of N,N-dimethyl acetamide (DMAc) as a solvent is charged into a double-walled 250 mL reactor, pre-heated to 25° C., and equipped with a mechanical stirrer and a nitrogen inlet. Then, 9.51 g (0.006 mol) of the 70 mole % of amide structural unit-containing oligomer prepared in Synthesis Example 1, 0.13 g (0.004 mol) of 2,2'-bis(trifluoromethyl)benzidine (TFDB), and 0.98 g (0.005 mol) of isophorone diamine (IPDA) are added thereto and dissolved, and the temperature is set to 25° C. Then, 0.85 g (0.002 mol) of 3,3',4,4'-biphenyltetracarboxylic dianhydride (BPDA), and 4.51 g (0.01 mol) of 4,4'-(hexafluoroisopropylidene)diphthalic anhydride (6FDA) are added thereto, and the mixture is stirred for 48 hours. Then, 1.03 g of pyridine and 4.0 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Example 8

84 grams of N,N-dimethyl acetamide (DMAc) as a solvent is charged into a double-walled 250 mL reactor, pre-heated to 25° C., and equipped with a mechanical stirrer and a nitrogen inlet. Then, 10.38 g (0.007 mol) of the 70 mole % of amide structural unit-containing oligomer prepared in Synthesis Example 1, 0.39 g (0.001 mol) of 2,2'-bis(trifluoromethyl)benzidine (TFDB), and 0.49 g (0.002 mol) of isophorone diamine (IPDA) are added thereto and dissolved, and the temperature is set to 25° C. Then, 0.85 g (0.002 mol) of 3,3',4,4'-biphenyltetracarboxylic dianhydride (BPDA), and 3.87 g (0.008 mol) of 4,4'-(hexafluoroisopropylidene)diphthalic anhydride (6FDA) are added thereto, and the mixture is stirred for 48 hours. Then, 0.92 g of pyridine and 3.56 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Example 9

84 grams of N,N-dimethyl acetamide (DMAc) as a solvent is charged into a double-walled 250 mL reactor, pre-heated to 25° C., and equipped with a mechanical stirrer and a nitrogen inlet. Then, 10.67 g (0.007 mol) of the 70 mole % of amide structural unit-containing oligomer prepared in Synthesis Example 1, 0.4 g (0.001 mol) of 2,2'-bis(trifluoromethyl)benzidine (TFDB), and 0.5 g (0.002 mol) of isophorone diamine (IPDA) are added thereto and dissolved, and the temperature is set to 25° C. Then, 1.75 g (0.005 mol) of 3,3',4,4'-biphenyltetracarboxylic dianhydride (BPDA), and 2.65 g (0.005 mol) of 4,4'-(hexafluoroisopropylidene)diphthalic anhydride (6FDA) are added thereto, and the mixture is stirred for 48 hours. Then, 0.94 g of pyridine and 3.66 g of acetic anhydride are added thereto, and the mixture is stirred for 24 hours to obtain a poly(amic acid-amide) copolymer solution, of which the solid content is 15 wt %.

After cooling the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 230° C., at a heating rate of 10° C. per minutes, maintained at 230° C. for about 20 minutes, and slowly cooled to room temperature to obtain a poly(amide-imide) copolymer film.

Comparative Example 1

84 grams of N,N-dimethyl acetamide (DMAc) as a solvent is charged into a double-walled 250 mL reactor, pre-heated to 25° C., and equipped with a mechanical stirrer and a nitrogen inlet, and 12.6 g (0.009 mol) of the 70 mole % of amide structural unit-containing oligomer prepared in Synthesis Example 1 is added thereto and dissolved. Then, 1.24 g (0.004 mol) of 3,3',4,4'-biphenyltetracarboxylic dianhydride (BPDA), and 2.14 g (0.004 mol) of 4,4'-(hexafluoroisopropylidene)diphthalic anhydride (6FDA) are added to the solution, and the mixture is stirred for 48 hours at 25° C. Then, 0.72 g of pyridine and 2.78 g of acetic anhydride are added thereto, and the mixture is stirred for 24 hours to obtain a poly(amic acid-amide) copolymer solution, of which the solid content is 18 wt %.

After cooling down the poly(amic acid-amide) solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 277° C., at a heating rate of 10° C. per minutes, maintained at 277° C. for about 11 minutes, and slowly cooled to room temperature to obtain a poly(amide-imide) copolymer film.

Comparative Example 2

84 grams of N,N-dimethyl acetamide (DMAc) as a solvent is charged into a double-walled 250 mL reactor, pre-heated to 25° C., and equipped with a mechanical stirrer and a nitrogen inlet, and 8.72 g (0.027 mol) of 2,2'-bis(trifluoromethyl)benzidine (TFDB) are added thereto and dissolved, and the temperature is set to 25° C. Then, 1.6 g (0.005 mol) of 3,3',4,4'-biphenyltetracarboxylic dianhydride (BPDA), and 9.67 g (0.021 mol) of 4,4'-(hexafluoroisopropylidene)diphthalic anhydride (6FDA) are added to the solution, and the mixture is stirred for 48 hours at 25° C. Then, 2.15 g of pyridine and 8.34 g of acetic anhydride are added thereto, and the mixture is stirred for 24 hours to obtain a polyamic acid solution, of which the solid content is 17 wt %.

After cooling down the polyamic acid solution to a temperature of 25° C., the solution is casted on a glass substrate, and dried for 40 minutes on a hot plate at a temperature of 100° C. Then, the film is separated from the glass substrate and introduced into a furnace, wherein the temperature is increased from room temperature to 277° C., at a heating rate of 10° C. per minutes, maintained at 277° C. for about 11 minutes, and slowly cooled to room temperature to obtain a polyimide film.

Evaluation: Evaluation of Mechanical and Optical Properties of the Films.

Each of the poly(amide-imide) copolymer films or polyimide film prepared in Examples 1 to 9 and Comparative Examples 1 and 2 are evaluated for mechanical properties and optical properties, and the obtained values are described in Table 1 below.

Particularly, a light transmittance, YI, YI difference after and before exposure to UV ray, haze, tensile modulus, and refractive index for each film are measured.

Yellowness index (YI), percent light transmittance (Trans. %, at a wavelength range of 350 nm to 750 nm), and haze are measured for a film having a thickness (THK) of about 50 micrometers (μm), according to an ASTM D1925 method by using a spectrophotometer, CM-3600d made by Konica Minolta Inc. YI difference (ΔYI) before and after exposure to UV light is measured as the YI difference before and after exposure to an ultraviolet (UV) lamp of a UVB wavelength region for 72 hours. See, Table 1, below.

Refractive index (R.I.) is measured by using Ellipsometer (M-2000, J.A. Woollam Co., Ltd.) in a visible ray region for the value of at 550 nanometer established by the Gen-Osc model.

Tensile modulus (TMod.) is measured according to an ASTM D882 method.

As shown in Table 1, the poly(amide-imide) copolymer film according to Comparative Example 1 is prepared by polymerizing only the aromatic diamine, aromatic tetracarboxylic dianhydride, and aromatic dicarbonyl compound, without including IPDA, and has a relatively high tensile modulus of 6.0, which is the next to the top of 6.1 of Example 7. However, the film has a high YI of 2.48, and a high refractive index of 1.70, which shows that the optical properties are not good.

On the contrary, all the films according to Examples 1 to 9, which includes IPDA, an alicyclic diamine, in an amount of less than or equal to 50 mole % based on the total amount of the diamines, have percent light transmittances of greater than or equal to 88.8%, which is significantly better than that of Comparative Example 1. Moreover, all the films according to Examples 1 to 9 exhibit YIs of less than 2, which are unexpectedly lower than that of Comparative Example 1, and refractive indices of less than 1.7, which are significantly lower than that of Comparative Example 1. In fact, all of the Example films exhibit a decrease in YI and refractive index as the amount of IPDA increases, with only a slight reduction (not more than 1 GPa) of tensile modulus compared with that of Comparative Example 1. Accordingly, the poly(amide-imide) copolymer films according to the Examples have greatly improved optical properties, while maintaining good mechanical properties. That is, the poly(amide-imide) copolymer films according to the Examples may have significantly improved optical properties, while maintaining an equivalent level of mechanical properties or having a slightly reduced mechanical properties compared with the film according to Comparative Example 1, which does not include an alicyclic diamine, such as, for example, IPDA.

The polyimide film according to Comparative Example 2 does not include an amide structural unit in the polymer structure, and thus, has very poor mechanical properties, such as, for example, a tensile modulus of 3.7. Also, the polyimide film according to Comparative Example 2 exhibits better optical properties to that of the poly(amide-imide) copolymer film according to Comparative Example 1. Although the polyimide film according to Comparative Example 2 may exhibit better light transmittance and refrac-

TABLE 1

| | Composition | Thick. [μm] | Trans. [%] | YI @ 50 μm | ΔYI [—] | Haze (%) | TMod. [GPa] | R.I. |
|---|---|---|---|---|---|---|---|---|
| Example 1 | TPCI/6FDA/BPDA/TFDB/IPDA 40/50/10/60/40 | 51 | 89.9 | 1.48 | 0.9 | 0.38 | 5.1 | 1.63 |
| Example 2 | TPCI/6FDA/BPDA/TFDB/IPDA 40/30/30/60/40 | 54 | 89.4 | 1.84 | 0.88 | 0.18 | 5.2 | 1.65 |
| Example 3 | TPCI/6FDA/BPDA/TFDB/IPDA 45/45/10/65/35 | 64 | 89.7 | 1.24 | 0.95 | 0.49 | 5.1 | 1.64 |
| Example 4 | TPCI/6FDA/BPDA/TFDB/IPDA 50/40/10/75/25 | 59 | 89.7 | 1.44 | 0.84 | 0.7 | 5.3 | 1.66 |
| Example 5 | TPCI/6FDA/BPDA/TFDB/IPDA 50/25/25/75/25 | 53 | 89.1 | 1.88 | 0.84 | 0.6 | 5.9 | 1.67 |
| Example 6 | TPCI/6FDA/BPDA/TFDB/IPDA 55/22.5/22.5/80/20 | 62 | 89 | 1.85 | 0.1 | 0.27 | 5.9 | 1.66 |
| Example 7 | TPCI/6FDA/BPDA/TFDB/IPDA 55/10/35/80/22 | 40 | 89.4 | 1.93 | 0.95 | 0.7 | 6.1 | 1.62 |
| Example 8 | TPCI/6FDA/BPDA/TFDB/IPDA 60/30/10/90/10 | 46 | 89.3 | 1.84 | 0.93 | 0.24 | 5.8 | 1.67 |
| Example 9 | TPCI/6FDA/BPDA/TFDB/IPDA 60/20/20/90/10 | 68 | 88.8 | 1.84 | 0.18 | 0.61 | 5.8 | 1.65 |
| Comp. Example 1 | TPCI/6FDA/BPDA/TFDB 70/16/14/100 | 50 | 88.6 | 2.48 | 0.8 | 0.67 | 6.0 | 1.70 |
| Comp. Example 2 | 6FDA/BPDA/TFDB 80/20/100 | 47 | 90.2 | 1.73 | 0.47 | 0.56 | 3.7 | 1.60 | tive index than the poly(amide-imide) copolymer films according to Examples 1 to 9, Comparative Example 2 has a far inferior YI.

As shown above, the poly(amide-imide) copolymer according to an embodiment is prepared by using an aromatic diamine, an aromatic dianhydride, an aromatic dicarbonyl compound, and an alicyclic diamine, which includes a cyclohexylene group between two amino groups, and thus, has greatly improved optical properties, such as, for example, a lowered refractive index, for example, less than 1.7, whereby a higher light transmittance, for example, greater than or equal to 88.8%, in a wavelength range of from 350 nm to 750 nm, and a lowered YI, for example, less than 2, while maintaining good mechanical properties, such as, for example, a tensile modulus of greater than or equal to 5 GPa. Accordingly, the poly(amide-imide) copolymer according to an embodiment may improve both the optical and mechanical properties, which are not easy to simultaneously improve. Accordingly, the poly(amide-imide) copolymer according to an embodiment having improved optical and mechanical properties may advantageously be used for a window film of a display device that requires greatly improved mechanical and optical properties.

While this disclosure has been described in connection with what is presently considered to be practical exemplary embodiments, it is to be understood that the present disclosure is not limited to the embodiments presented herein, but, on the contrary, is intended to cover various modifications and equivalent arrangements included within the spirit and scope of the appended claims.

What is claimed is:

1. A poly(amide-imide) copolymer prepared from reactants that consist of a diamine represented by Chemical Formula 1, a diamine represented by Chemical Formula 2, a dicarbonyl compound represented by Chemical Formula 3, and a tetracarboxylic acid dianhydride:

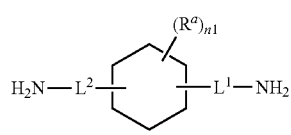

Chemical Formula 1 wherein in Chemical Formula 1,
$R^a$ is a substituted or unsubstituted C1 to C4 alkyl group, $L^2$ is a single bond, and $L^1$ is a substituted or unsubstituted C1 to C10 alkylene group, and
n1 is an integer ranging from 1 to 3;

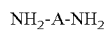

Chemical Formula 2 wherein in Chemical Formula 2,
A is represented by Chemical Formula 6:

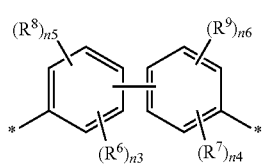

Chemical Formula 6 wherein, in Chemical Formula 6,
$R^8$ and $R^9$ are each independently a halogen or C1-C2 haloalkyl, n3 is 0, n5 is an integer ranging from 1 to 3, and
n4 is 0, n6 is an integer ranging from 1 to 3;
wherein an amount of the diamine represented by Chemical Formula 1 accounts for 10 mole percent to 25 mole percent based on the total amount of the diamine represented by Chemical Formula 1 and the diamine represented by Chemical Formula 2;

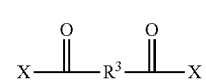

Chemical Formula 3 wherein, in Chemical Formula 3,
$R^3$ is a substituted or unsubstituted phenylene group or a substituted or unsubstituted biphenylene group, and
each X is an identical or different halogen atom;
wherein the tetracarboxylic acid dianhydride comprises at least one of 3,3',4,4'-biphenyl tetracarboxylic dianhydride (BPDA),
3,3',4,4'-diphenylsulfone tetracarboxylic dianhydride (DSDA),
4,4'-(hexafluoroisopropylidene)diphthalic anhydride (6FDA), or 4,4'-oxydiphthalic anhydride (ODPA); and
wherein a mole ratio of the dicarbonyl compound represented by Chemical Formula 3 and the tetracarboxylic acid dianhydride 4 is 30 to 70:70 to 30.

2. The poly(amide-imide) copolymer according to claim 1, wherein the diamine represented by Chemical Formula 2 comprises at least one of the diamines represented by chemical formulae:

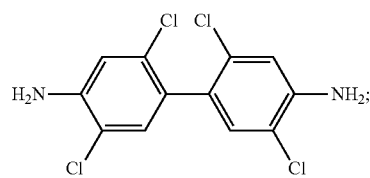

3. The poly(amide-imide) copolymer according to claim 1, wherein the diamine represented by Chemical Formula 2 comprises a diamine represented by Chemical Formula A:

Chemical Formula A

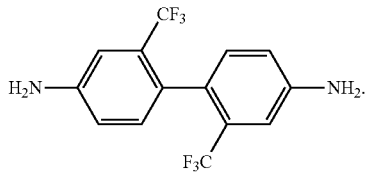

4. The poly(amide-imide) copolymer according to claim 1, wherein in Chemical Formula 3, $R^3$ is a phenylene group, and each X is independently Cl or Br.

5. The poly(amide-imide) copolymer according to claim 1, wherein the tetracarboxylic acid dianhydride comprises a combination of 3,3',4,4'-biphenyl tetracarboxylic dianhydride and 4,4'-(hexafluoroisopropylidene)diphthalic anhydride.

6. The poly(amide-imide) copolymer according to claim 1, wherein the mole ratio of the dicarbonyl compound represented by Chemical Formula 3 and the tetracarboxylic acid dianhydride is from 50:50 to 60:40.

7. A composition for preparing a poly(amide-imide) copolymer consisting of a diamine represented by Chemical Formula 1, a tetracarboxylic acid dianhydride, and a compound represented by Chemical Formula 5:

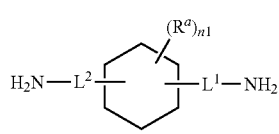

Chemical Formula 1 wherein, in Chemical Formula 1,
$R^a$ is a substituted or unsubstituted C1 to C4 alkyl group;
$L^2$ is a single bond, and $L^1$ is a substituted or unsubstituted C1 to C10 alkylene group, and
n1 is an integer ranging from 1 to 3;
wherein the tetracarboxylic acid dianhydride comprises at least one of 3,3',4,4'-biphenyl tetracarboxylic dianhydride (BPDA),
3,3',4,4'-diphenylsulfone tetracarboxylic dianhydride (DSDA),
4,4'-(hexafluoroisopropylidene)diphthalic anhydride (6FDA), or 4,4'-oxydiphthalic anhydride (ODPA);

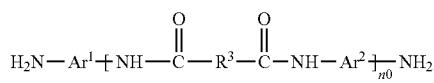

Chemical Formula 5 wherein, in Chemical Formula 5,
$R^3$ is a substituted or unsubstituted phenylene group or a substituted or unsubstituted biphenylene group,
n0 is an integer ranging from 1 or more, and $Ar^1$ and $Ar^2$ are each independently represented by Chemical Formula 6:

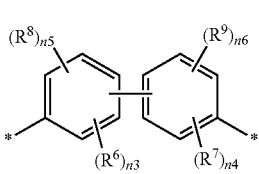

Chemical Formula 6 wherein, in Chemical Formula 6,
$R^8$ and $R^9$ are each independently a halogen or C1-C2 haloalkyl,
n3 is 0, n5 is an integer ranging from 1 to 3, and
n4 is 0, n6 is an integer ranging from 1 to 3;
wherein $Ar^1$ and $Ar^2$ are each independently derived from a diamine represented by Chemical Formula 2:

 $NH_2$-A-$NH_2$   Chemical Formula 2 wherein in Chemical Formula 2,
A is represented by the above Chemical Formula 6; and
wherein an amount of the diamine represented by Chemical Formula 1 accounts for 10 mole percent to 25 mole percent based on the total amount of the diamine represented by Chemical Formula 1 and the diamine represented by Chemical Formula 2, and the amount of the diamine represented by Chemical Formula 2 is the amount required for preparing the compound represented by Chemical Formula 5.

8. The composition for preparing a poly(amide-imide) copolymer according to claim 7, wherein the tetracarboxylic acid dianhydride represented by Chemical Formula 4 consists of a combination of 3,3,4,4-biphenyl tetracarboxylic dianhydride (BPDA), and
4,4'-(hexafluoroisopropylidene)diphthalic anhydride (6FDA).

9. An article comprising a poly(amide-imide) copolymer according to claim 1.

10. The article according to claim 9, wherein the article comprises a film, wherein the film has a light transmittance of greater than or equal to 88.8 percent (%) in a wavelength range from 350 nanometers (nm) to 750 nanometers, a yellowness index (YI) of less than 2, a refractive index of less than 1.7, and a tensile modulus of greater than or equal to 5 GPa.

11. A display device comprising the article according to claim 9.

12. The poly(amide-imide) copolymer according to claim 1, wherein the diamine represented by Chemical Formula 1 is isophorone diamine.

13. The composition for preparing a poly(amide-imide) copolymer according to claim 7, wherein the diamine represented by Chemical Formula 1 is isophorone diamine.

* * * * *